United States Patent
Lee et al.

(10) Patent No.: US 9,954,142 B2
(45) Date of Patent: Apr. 24, 2018

(54) MATERIAL LAYER STACK, LIGHT EMITTING ELEMENT, LIGHT EMITTING PACKAGE, AND METHOD OF FABRICATING LIGHT EMITTING ELEMENT

(71) Applicant: SAMSUNG ELECTRONICS CO., LTD., Suwon-si (KR)

(72) Inventors: Keon-Hun Lee, Seoul (KR); Eun-Deok Sim, Yongin-si (KR); Suk-Ho Yoon, Seoul (KR); Jeong-Wook Lee, Yongin-si (KR); Do-Young Rhee, Seoul (KR); Kee-Won Lee, Suwon-si (KR); Chul-Min Kim, Gunpo-si (KR); Tae-Bang Nam, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/241,316

(22) Filed: Aug. 19, 2016

(65) Prior Publication Data

US 2017/0098736 A1    Apr. 6, 2017

(30) Foreign Application Priority Data

Oct. 5, 2015 (KR) .......................... 10-2015-0139990

(51) Int. Cl.
| | |
|---|---|
| H01H 13/83 | (2006.01) |
| H01L 33/32 | (2010.01) |
| H01L 33/54 | (2010.01) |
| H01L 33/62 | (2010.01) |
| H01L 33/02 | (2010.01) |

(52) U.S. Cl.
CPC .......... *H01L 33/325* (2013.01); *H01L 33/025* (2013.01); *H01L 33/54* (2013.01); *H01L 33/62* (2013.01); *H01L 2224/48091* (2013.01); *H01L 2224/48227* (2013.01); *H01L 2224/48237* (2013.01); *H01L 2924/181* (2013.01)

(58) Field of Classification Search
CPC ..................................................... H01L 13/83
See application file for complete search history.

(56) References Cited

U.S. PATENT DOCUMENTS

| 6,320,207 B1 | 11/2001 | Furukawa et al. |
| 6,372,608 B1 | 4/2002 | Shimoda et al. |
| 6,645,830 B2 | 11/2003 | Shimoda et al. |

(Continued)

FOREIGN PATENT DOCUMENTS

| JP | 2000-294829 A | 10/2000 |
| JP | 2013-55280 A | 3/2013 |

(Continued)

*Primary Examiner* — Zandra Smith
*Assistant Examiner* — Andre' C Stevenson
(74) *Attorney, Agent, or Firm* — Sughrue Mion, PLLC

(57) ABSTRACT

Disclosed herein are a material layer stack, a light emitting element, a light emitting package, and a method of fabricating a light emitting element. The material layer stack includes: a substrate having a first lattice constant; and a semiconductor layer grown on the substrate, the semiconductor layer having a second lattice constant that is different from the first lattice constant. Using the material layer stack, a light emitting element having a low leakage current, a low operation voltage, and an excellent luminous efficiency can be obtained.

20 Claims, 21 Drawing Sheets

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,409,895 B2 | 4/2013 | Zhu et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,829,489 B2 | 9/2014 | Konno et al. |
| 9,012,885 B2 | 4/2015 | Peter et al. |
| 9,012,939 B2 | 4/2015 | Chen et al. |
| 9,525,104 B2 * | 12/2016 | Lin ............... H01L 33/32 |
| 9,570,657 B2 * | 2/2017 | Chen ............... H01L 33/06 |
| 2013/0307001 A1 | 11/2013 | Lee et al. |

FOREIGN PATENT DOCUMENTS

| | | |
|---|---|---|
| KR | 10-2006-0007123 A | 1/2006 |
| KR | 10-0629857 B1 | 9/2006 |
| KR | 10-0899917 B1 | 5/2009 |
| KR | 10-1239856 B1 | 3/2013 |
| KR | 10-2014-0123217 A | 10/2014 |

* cited by examiner

MATERIAL LAYER STACK, LIGHT EMITTING ELEMENT, LIGHT EMITTING PACKAGE, AND METHOD OF FABRICATING LIGHT EMITTING ELEMENT

CROSS-REFERENCE TO THE RELATED APPLICATION

This application claims priority from Korean Patent Application No. 10-2015-0139990, filed on Oct. 5, 2015, in the Korean Intellectual Property Office, the disclosure of which is incorporated herein in its entirety by reference.

BACKGROUND

The inventive concept relates to a material layer stack, a light emitting element, a light emitting package, and a method of fabricating the light emitting element, and more particularly, to a light emitting element, which has a low leakage current, a low operation voltage, and an excellent luminous efficiency, a light emitting package, and methods of fabricating the same.

Semiconductor light emitting elements are semiconductor devices capable of generating light of various colors by recombination of electrons and holes in a junction area of first conductive type and second conductive type semiconductors when a current is applied to the semiconductor light emitting elements. Since the semiconductor light emitting elements have various merits such as longer lifespan, lower power consumption, and better initial drive characteristics than filament-based light emitting elements, demands for the semiconductor light emitting elements are continuously increasing. In particular, Group III nitride semiconductors capable of emitting blue-based light in a short wavelength region are recently spotlighted.

Such semiconductor light emitting elements have various problems due to growth of a semiconductor on a heterogeneous substrate having a different lattice constant, and there is a need for a method of harmonizing conflicts between these problems.

SUMMARY

Exemplary embodiments of the inventive concept provide a material layer stack rendering a light emitting element having a low leakage current, a low operation current, and an excellent luminous efficiency.

The embodiments also provide a light emitting element having a low leakage current, a low operation current, and an excellent luminous efficiency.

The embodiments also provide a light emitting package having a low leakage current, a low operation current, and an excellent luminous efficiency.

The embodiments also provide a method of fabricating a light emitting element having a low leakage current, a low operation current, and an excellent luminous efficiency.

According to exemplary embodiments of the inventive concept, there is provided a material layer stack which includes: a substrate having a first lattice constant; and a semiconductor layer grown on the substrate, the semiconductor layer having a second lattice constant that is different from the first lattice constant. The semiconductor layer may include: a first impurity layer having a first impurity concentration; a second impurity layer having a second impurity concentration that is greater than the first impurity concentration; and a third impurity layer having a third impurity concentration that is greater than the second impurity concentration.

Among the first impurity layer, the second impurity layer, and the third impurity layer, the first impurity layer may be disposed to be the closest to the substrate, and the third impurity layer may be disposed to be the farthest away from the substrate. In particular, impurities included in the first impurity layer, the second impurity layer, and the third impurity layer may have the same conductivity types. The impurities included in the first impurity layer, the second impurity layer, and the third impurity layer may be impurities having n-type conductivity. The impurities may be silicon (Si) or carbon (C).

The impurity concentrations of the first impurity layer, the second impurity layer, and the third impurity layer may change discretely at interfaces of the impurity layers in proportion to a height from the substrate. Here, a thickness of the second impurity layer may be about 0.8 times to about 1.2 times a thickness of the first impurity layer. In addition, a thickness of the third impurity layer may be about 1.8 times to about 2.2 times the thickness of the first impurity layer.

The first impurity layer may have an impurity concentration of about $1.0 \times 10^{17}$ cm$^{-3}$ to about $2.0 \times 10^{18}$ cm$^{-3}$. The second impurity layer may have an impurity concentration of about $5.0 \times 10^{17}$ cm$^{-3}$ to about $5.0 \times 10^{18}$ cm$^{-3}$. The third impurity layer may have an impurity concentration of about $5.0 \times 10^{18}$ cm$^{-3}$ to about $2.0 \times 10^{19}$ cm$^{-3}$.

According to other exemplary embodiments of the inventive concept, there is provided a light emitting element which includes: a first conductivity type semiconductor layer; a second conductivity type semiconductor layer; and an active layer interposed between the first conductivity type semiconductor layer and the second conductivity type semiconductor layer. The first conductivity type semiconductor layer may include: a first impurity layer having a first impurity concentration; a second impurity layer having a second impurity concentration that is greater than the first impurity concentration; and a third impurity layer having a third impurity concentration that is greater than the second impurity concentration.

The first impurity layer, the second impurity layer, and the third impurity layer may be sequentially stacked, and the third impurity layer may contact the active layer. The impurity concentration in each of the impurity layers may be substantially constant. The thickness of the third impurity layer may be substantially equal to a sum of the thickness of the first impurity layer and the thickness of the second impurity layer.

When the impurity concentration of the first impurity layer is A, the impurity concentration of the second impurity layer is B, and the impurity concentration of the third impurity layer is C, a relationship of C>A+B may be satisfied. In some embodiments, a relationship of C>B>A may be satisfied. In some embodiments, a relationship of C>2A+B may be satisfied.

The first impurity layer may have crystallinity that is higher than crystallinity of the third impurity layer. A sum of thicknesses of the first impurity layer, the second impurity layer, and the third impurity layer may range from about 3 μm to about 5 μm. An impurity concentration gradient at an interface between the second impurity layer and the third impurity layer may be greater than an impurity concentration gradient at an interface between the first impurity layer and the second impurity layer.

According to still other exemplary embodiments of the inventive concept, there is provided a light emitting element which includes: a first conductivity type semiconductor layer; a second conductivity type semiconductor layer; and an active layer interposed between the first conductivity type semiconductor layer and the second conductivity type semiconductor layer, wherein the first conductivity type semiconductor layer sequentially includes a first impurity layer, a second impurity layer, and a third impurity layer, and respective impurity concentrations of the first impurity layer, the second impurity layer, and the third impurity layer sequentially increase. Impurity concentrations at interfaces between the first impurity layer, the second impurity layer, and the third impurity layer may substantially discontinuously change.

In some embodiments, when a change in impurity concentration at the interface between the first impurity layer and the second impurity layer is M, and a change in impurity concentration at the interface between the second impurity layer and the third impurity layer is N, a relationship of N>2M may be satisfied.

Among the first impurity layer, the second impurity layer, and the third impurity layer, the first impurity layer may be disposed to be the farthest away from the active layer, and the third impurity layer may be disposed to be the closest to the active layer. In addition, the first impurity layer may have crystallinity that is higher than crystallinity of the third impurity layer. The impurity concentration in each of the impurity layers may be substantially constant.

According to still other exemplary embodiments of the inventive concept, there is provided a light emitting package which includes: a light emitting element mounted on a package substrate; a connector electrically connecting the package substrate to the light emitting element; and a molding unit molding the light emitting element. The light emitting element may be the light emitting element set forth above.

According to still other exemplary embodiments of the inventive concept, there is provided a method of fabricating a light emitting element, which includes: forming a first conductivity type semiconductor layer on a substrate; and sequentially forming an active layer and a second conductivity type semiconductor layer on the first conductivity type semiconductor layer. Here, the forming the first conductivity type semiconductor layer may include: forming a first impurity layer on the substrate, the first impurity layer being doped with an impurity at a first impurity concentration; forming a second impurity layer on the first impurity layer, the second impurity layer being doped with an impurity at a second impurity concentration that is higher than the first impurity concentration; and forming a third impurity layer on the second impurity layer, the third impurity layer being doped with an impurity at a third impurity concentration that is higher than the second impurity concentration.

Here, the first impurity layer may have surface uniformity that is higher than surface uniformity of the second impurity layer. In addition, the concentration of the impurity supplied in the forming the third impurity layer may be greater than twice the concentration of the impurity supplied in the forming the second impurity layer. Further, the method of fabricating the light emitting element may further include forming an undoped semiconductor layer, before the forming the first conductivity type semiconductor layer.

According to still other exemplary embodiments of the inventive concept, there is provided a method of fabricating a light emitting element, which includes: forming a first conductivity type semiconductor layer on a substrate; and sequentially forming an active layer and a second conductivity type semiconductor layer on the first conductivity type semiconductor layer. Here, the forming the first conductivity type semiconductor layer includes: supplying an impurity source gas at a first flow rate to form a first impurity layer on the substrate; supplying an impurity source gas at a second flow rate to form a second impurity layer on the first impurity layer, the second flow rate being greater than the first flow rate; and supplying an impurity source gas at a third flow rate to form a third impurity layer on the second impurity layer, the third flow rate being greater than the second flow rate. Here, the third flow rate may be greater than a sum of the first flow rate and the second flow rate.

In addition, the supplying the impurity source gas at the second flow rate may be performed for a time period that is longer than that of the supplying the impurity source gas at the first flow rate, and the supplying the impurity source gas at the third flow rate may be performed for a time period that is longer than that of the supplying the impurity source gas at the second flow rate. Here, the time period of the supplying the impurity source gas at the third flow rate may be greater than a sum of the time period of the supplying the impurity source gas at the first flow rate and the time period of the supplying the impurity source gas at the second flow rate.

BRIEF DESCRIPTION OF THE DRAWINGS

Various exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
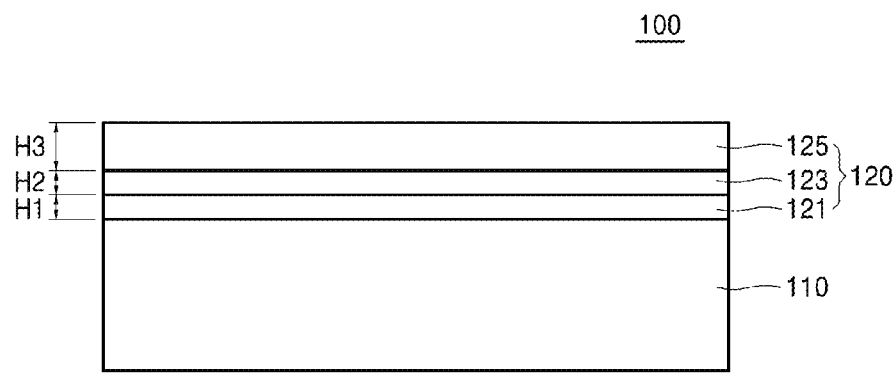
FIG. 1 is a sectional side view of a material layer stack according to an embodiment.

Hereinafter, embodiments of the inventive concept will be described in detail with reference to the accompanying drawings. It should be understood that all of the embodiment described herein are exemplary, and the inventive concept is not limited to these embodiments and may be embodied in different ways or forms, and that the embodiments are provided for complete disclosure and thorough understanding of the inventive concept by those of ordinary skill in the art. Like components will be denoted by like reference numerals throughout the specification. In the drawings, the widths, lengths, thicknesses and the like of components may be exaggerated for convenience.

It will be also understood that although the terms such as "first", "second" and the like may be used herein to describe various components, these components should not be limited by these terms. These terms may be used only to distinguish one component from another component. For example, a first component could be termed a second component without departing from the scope of the inventive concept, and a second component could also be termed a first component likewise.

The terminology used herein is only for the purpose of describing specific embodiments and is not intended to limit the inventive concept. As used herein, the singular terms "a," "an" and "the" are intended to include the plural forms as well, unless the context clearly indicates otherwise. It will be understood that the terms such as "comprises", "comprising", "includes", "including", "has", and "having", when used herein, specify the presence of stated features, numbers, operations, components, parts, or combinations thereof, but do not preclude the presence or addition of one or more other features, numbers, operations, components, parts, or combinations thereof.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms used herein, including technical and scientific terms, have the same meaning as generally understood by those of ordinary skill in the art. It will be understood that terms, such as those defined in generally used dictionaries, should be interpreted as having a meaning that is consistent with meanings understood in the context of the related art, and will not be interpreted in an idealized or overly formal sense unless expressly so defined herein.

When an embodiment can be otherwise realized, specific processes may be performed in a different order from a described order. For example, two processes consecutively described may be substantially simultaneously performed, and may also be performed in an opposite order to a described order.

In the accompanying drawings, variations of illustrated shapes can be anticipated, for example, depending on fabrication techniques and/or tolerances. Thus, embodiments of the inventive concept are not to be construed as being limited to specific shapes of regions illustrated herein, and are to be construed as including, for example, variations of shapes and forms caused in the process of fabrication. As used herein, the term "and/or" includes any and all combinations of one or more of the associated listed items. Expressions such as "at least one of," when preceding a list of elements, modify the entire list of elements and do not modify the individual elements of the list. In addition, the term "substrate" used herein may refer to a substrate itself, or a stacked structure including a substrate and a certain layer, film, or the like on a surface of the substrate. Further, the term "surface of a substrate" may refer to an exposed surface of a substrate itself, or an outer surface of a certain layer, film, or the like on the substrate.

FIG. 1 is a sectional side view of a material layer stack 100 according to an embodiment.

Referring to FIG. 1, the material layer stack 100 may include a substrate 110 and a semiconductor layer 120.

The substrate 110 may be an insulating substrate such as a sapphire substrate, without being limited thereto. The substrate 110 may be a conductive or semiconductor substrate other than the insulating substrate. For example, the substrate 110 may include SiC, Si, $MgAl_2O_4$, MgO, $LiAlO_2$, LiGaO$_2$, or GaN other than sapphire. The substrate 110 may by characterized by a first lattice constant of a material forming the substrate 110. The substrate 110 may serve as a base for growing the semiconductor layer 120 thereon.

When the substrate 110 is a sapphire substrate, the sapphire substrate is a crystal having hexagonal-rhombohedral (Hexa-Rhombo R3c) symmetry, c-axis and a-axis directional lattice constants of the crystal are 13.001 and 4.758, respectively, and the crystal has a C (0001) plane, an A (1120) plane, an R (1102) plane, or the like. Since a C plane sapphire substrate facilitates growth of a nitride thin film thereon, and is stable at a high temperature, the C plane sapphire substrate is mainly used as a substrate for growth of nitride.

Another material that may be used for the substrate 110 may be silicon (Si). Since a silicon substrate is more suitable for producing a large diameter substrate and has a relatively low price, mass productivity can be realized. However, since a difference in lattice constant between GaN, included in the semiconductor layer 120, and the Si substrate having a (111) plane as a substrate plane is about 17%, there is a need for a technique of suppressing generation of crystal defects due to the difference in lattice constant. In addition, a difference in coefficient of thermal expansion between silicon and GaN is about 56%, and there is a need for a technique of suppressing wafer warpage generated due to the difference in coefficient of thermal expansion. Due to wafer warpage, a GaN thin film may suffer from cracks, and there may occur problems such as an increase in dispersion of emission wavelengths in the same wafer due to difficulty in process control, and the like.

The semiconductor layer 120 may include a semiconductor doped with an n-type or p-type impurity, and may be characterized by a second lattice constant of a material forming the semiconductor layer 120, and this second lattice constant is different from the first lattice constant. The semiconductor layer 120 may include a Group III nitride semiconductor, for example, a material having composition of Al$_x$In$_y$Ga$_{(1-x-y)}$N (0≤x≤1, 0≤y≤1, 0≤x+y≤1), without being limited thereto. In addition, the semiconductor layer 120 may also include a material such as an AlGaInP-based semiconductor or an AlGaAs-based semiconductor. In some embodiments, the semiconductor layer 120 may include n-type GaN.

The semiconductor layer 120 may include a first impurity layer 121, a second impurity layer 123, and a third impurity layer 125, which are respectively doped with impurities. In some embodiments, the impurities doped into the respective impurity layers 121, 123, 125 may be impurities of the same conductivity type. In some embodiments, the impurities doped into the respective impurity layers 121, 123, 125 may be n-type impurities. In some embodiments, the impurities doped into the respective impurity layers 121, 123, 125 may be, for example, silicon (Si) or carbon (C).

The first impurity layer 121 may have an impurity concentration that is substantially constant. In some embodiments, the first impurity layer 121 may have an impurity concentration of about 1.0×10$^{17}$ cm$^{-3}$ to about 2.0×10$^{18}$ cm$^{-3}$. The first impurity layer 121 has a relatively low impurity concentration, and thus, has higher surface crystallinity and surface uniformity than impurity layers having higher impurity concentrations. Here, the term "impurity concentration" may mean impurity doping concentration or doping concentration.

The second impurity layer 123 may also have an impurity concentration that is substantially constant. In some embodiments, the second impurity layer 123 may have an impurity concentration of about 5.0×10$^{17}$ cm$^{-3}$ to about 5.0×10$^{18}$ cm$^{-3}$. The second impurity layer 123 may have a higher impurity concentration than the first impurity layer 121.

The third impurity layer 125 may also have an impurity concentration that is substantially constant. In some embodiments, the third impurity layer 125 may have an impurity concentration of about 5.0×10$^{18}$ cm$^{-3}$ to about 2.0×10$^{19}$ cm$^{-3}$. The third impurity layer 125 may have a higher impurity concentration than the second impurity layer 123. Since the third impurity layer 125 has a relatively high impurity concentration, the third impurity layer 125 may have better electrical conductivity than the first impurity layer 121 and the second impurity layer 123, which have a lower impurity concentration.

The statement that the impurity concentration in each of the impurity layers 121, 123, 125 is substantially constant may mean that an impurity concentration at an arbitrary height in each of the impurity layers 121, 123, 125 ranges from +10% to −10% of an average impurity concentration in the corresponding impurity layer.

Figure 2A:
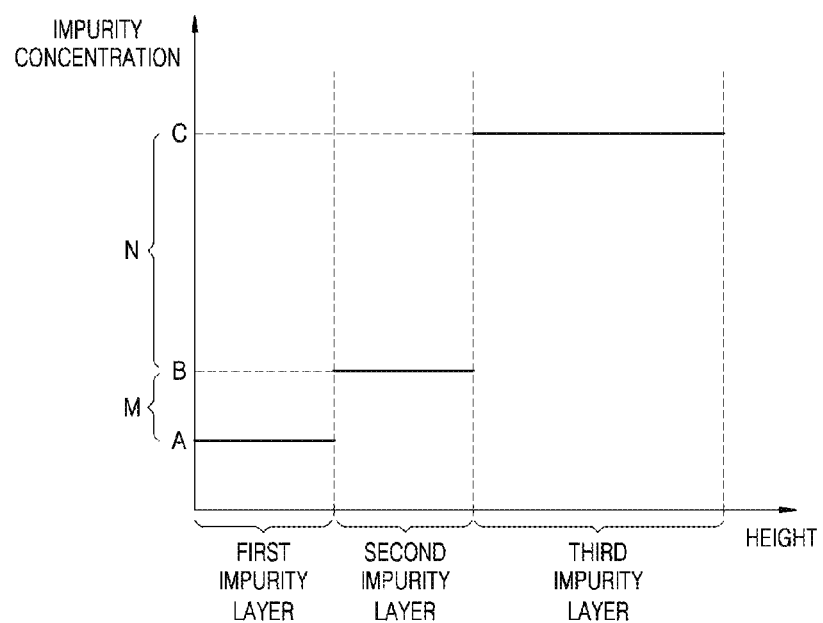
FIG. 2A is a graph conceptually depicting changes in impurity concentration according to a height of each of impurity layers in accordance with an embodiment.

FIG. 2A is a graph conceptually depicting changes in impurity concentration according to a height of each of the impurity layers 121, 123, 125.

Referring to FIG. 2A, a horizontal axis represents a height from the bottom of the semiconductor layer 120, and three horizontal segments respectively corresponding to the first impurity layer 121, the second impurity layer 123, and the third impurity layer 125 are shown in the stated order from the left to the right on the horizontal axis. A vertical axis represents an impurity concentration at a corresponding height, and the impurity concentration may be given in predetermined concentration units.

As shown in FIG. 2A, the impurity concentration of the semiconductor layer 120 may change according to a step shape. In particular, the impurity concentration may discontinuously change at interfaces between the impurity layers 121, 123, 125. Specifically, the impurity concentration may discontinuously change at the interface between the first impurity layer 121 and the second impurity layer 123 and at the interface between the second impurity layer 123 and the third impurity layer 125.

If the impurity concentration discontinuously changes at the interfaces between the impurity layers 121, 123, 125, since locations of the interfaces can be clearly identified, thicknesses H1, H2, H3 (as shown in FIG. 1) of the respective impurity layers 121, 123, 125 can be clearly determined.

Widths of the segments representing the impurity layers 121, 123, 125 in FIG. 2A may respectively correspond to the thicknesses H1, H2, H3 of the impurity layers 121, 123, 125 in FIG. 1. A thickness ratio between the first impurity layer 121, the second impurity layer 123, and the third impurity layer 125 has influence on electrical characteristics of the material layer stack finally obtained. Details thereof will be described below.

In some embodiments, a thickness of the second impurity layer 123 may be about 0.8 times to about 1.2 times the thickness of the first impurity layer 121. In some embodiments, a thickness of the third impurity layer 125 may be about 1.8 times to about 2.2 times the thickness of the first impurity layer 121. If the thickness ratio between the impurity layers 121, 123, 125 is out of the range set forth above, the material layer stack may not exhibit desired electrical characteristics.

In some embodiments, the thickness of the third impurity layer 125 may be substantially the same as a sum of the thicknesses of the first impurity layer 121 and the second impurity layer 123. In some embodiments, the thickness of the third impurity layer 125 may range from 80% to 120% of the sum of the thicknesses of the first impurity layer 121 and the second impurity layer 123.

In some embodiments, a sum of the thicknesses of the first impurity layer 121, the second impurity layer 123, and the third impurity layer 125 may range from about 3 µm to about 5 µm. In some embodiments, the sum of the thicknesses of the first impurity layer 121, the second impurity layer 123, and the third impurity layer 125 may range from about 3.8 µm to about 4.5 µm.

In addition, the concentration of the impurities doped into the respective impurity layers 121, 123, 125 also have influence on electrical characteristics of the material layer stack 100.

As shown in FIG. 2A, when the concentration of the impurity doped into the first impurity layer 121 is A, the concentration of the impurity doped into the second impurity layer 123 is B, and the concentration of the impurity doped into the third impurity layer 125 is C, the material layer stack may exhibit excellent electrical characteristics if a certain relationship between A, B, and C is satisfied.

In some embodiments, the impurity concentration of the second impurity layer 123 may be greater than the impurity concentration of the first impurity layer 121. In some embodiments, the impurity concentration of the third impurity layer 125 may be greater than the impurity concentration of the second impurity layer 123. Therefore, in some embodiments, inequality of C>B>A may be satisfied.

In some embodiments, C may be greater than A+B. A light emitting element, which is fabricated using a material layer stack not satisfying this relationship, may have a higher operation voltage and a lower luminous efficiency than a light emitting element which is fabricated using a material layer stack satisfying the relationship.

In some embodiments, the impurity concentration C of the third impurity layer 125 may be significantly greater than the impurity concentration A of the first impurity layer 121 and the impurity concentration B of the second impurity layer 123. In this case, a relationship of C>2A+B may be satisfied. A light emitting element, which is fabricated using a material layer stack not satisfying this relationship, may have a greater leakage current than a light emitting element which is fabricated using a material layer stack satisfying the relationship.

In some embodiments, differences in impurity concentration between the impurity layers 121, 123, 125 may have influence on the electrical characteristics of the material layer stack 100.

In some embodiments, when a change in impurity concentration at the interface between the first impurity layer 121 and the second impurity layer 123 is M, and a change in impurity concentration at the interface between the second impurity layer 123 and the third impurity layer 125 is N, a relationship of N>2M may be satisfied. If M and N are expressed by the values of the impurity concentrations set forth above, M is equal to B-A, and N is equal to C-B.

In some embodiments, if the relationship of N>2M is not satisfied, the luminous efficiency of the light emitting element may be insufficient.

When the above properties of the first impurity layer 121 to the third impurity layer 125 are considered overall, the first impurity layer 121 may suffer from crystal defects and/or 3-dimensional surfaces due to a difference in lattice constant between the first impurity layer 121 and the substrate 110. Therefore, the first impurity layer 121 can have excellent crystallinity and surface uniformity by keeping the impurity concentration of the first impurity layer 121 as small as possible.

In addition, the third impurity layer 125 can have uniform electrical conductivity by increasing the impurity concentration of the third impurity layer 125.

As described above, performance of the light emitting element obtained using the material layer stack cannot be improved only by increasing the impurity concentration stage by stage according to a distance from the substrate. It has been discovered by inventors of the inventive concept that the electrical characteristics of the material layer stack may be significantly influenced by factors, such as the thicknesses of the respective impurity layers 121, 123, 125, the impurity concentrations of the respective impurity layers 121, 123, 125, and the like, with increasing impurity concentration from the first impurity layer 121 to the third impurity layer 125.

Figure 2B:
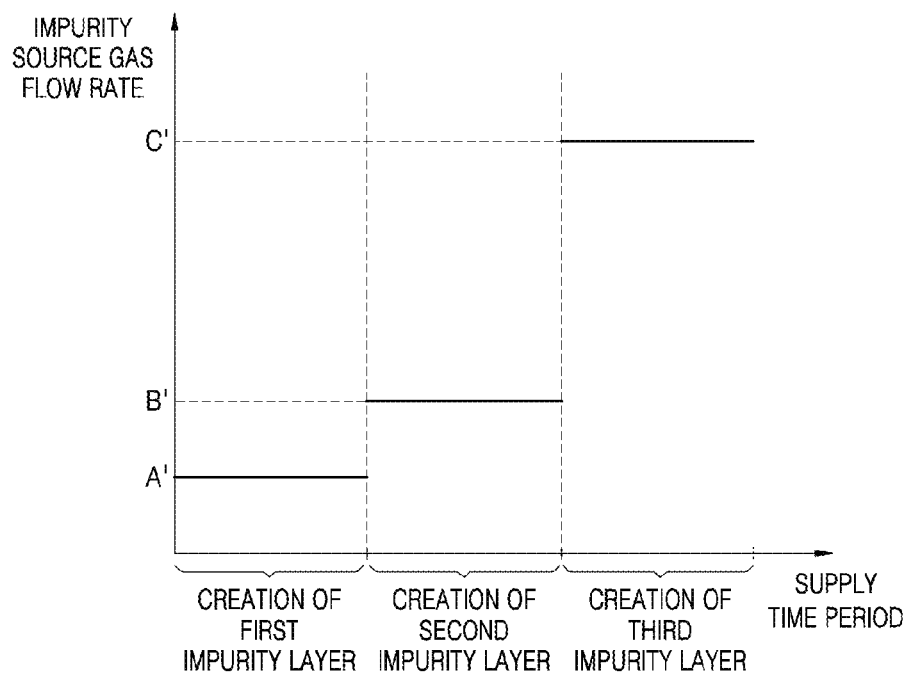
FIGS. 2B and 2C are graphs for explaining methods of fabricating a light emitting element according to embodiments, which can cause the changes in impurity concentration as in the graph of FIG. 2A.
Figure 2C:
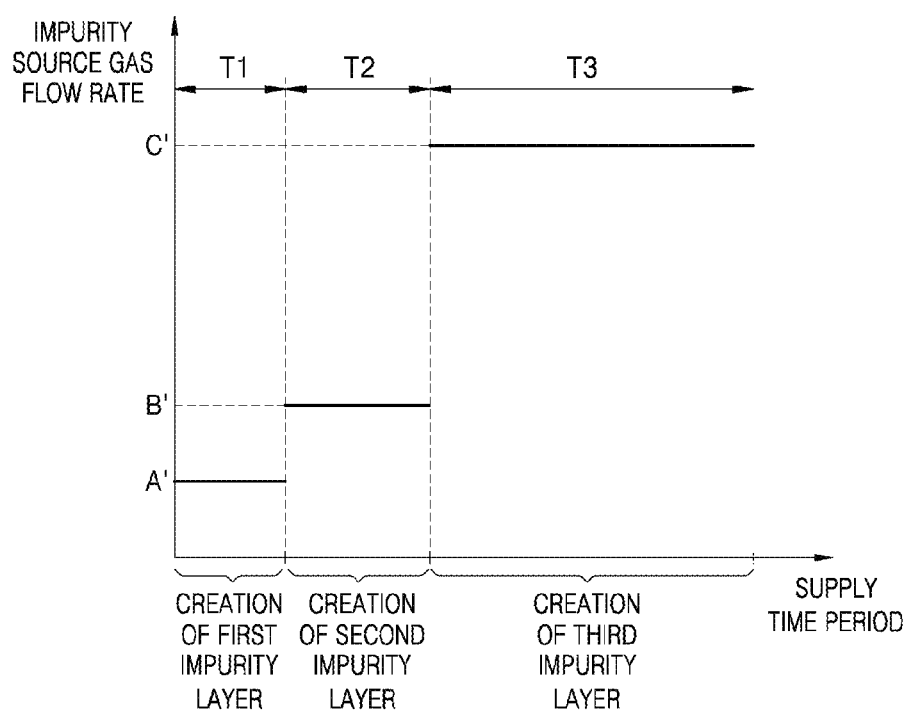

FIGS. 2B and 2C are graphs for explaining methods of fabricating a light emitting element according to embodiments, which can cause different impurity concentrations as in the graph of FIG. 2A.

Referring to FIG. 2B, to form the first impurity layer 121, an impurity source gas may be supplied at a first flow rate A'. Here, the first impurity layer 121 may be formed through reaction of the impurity source gas with other reaction gases.

Next, the second impurity layer 123 may be formed by supplying an impurity source gas at a second flow rate B' that is greater than the first flow rate A'. As a result, a concentration of the impurity source gas in a reaction chamber may proportionally increase. The reason of this is that the impurity source gas is supplied into the same reaction chamber at the second flow rate B' that is greater than the first flow rate A'. Since the concentration of the impurity source gas in the reaction chamber is higher upon formation of the second impurity layer 123 than upon formation of the first impurity layer 121, the impurity concentration of the second impurity layer 123 is also higher than the impurity concentration of the first impurity layer 121.

Next, the third impurity layer 125 may be formed by supplying an impurity source gas at a third flow rate C' that is greater than the second flow rate B'. As a result, due to the reason as described above, the third impurity layer 125 having an impurity concentration that is higher than the impurity concentration of the second impurity layer 123 can be obtained.

In some embodiments, the third flow rate C' may be greater than a sum of the first flow rate A' and the second flow rate B'. That is, a relationship of C'>A'+B' may be satisfied. In some embodiments, the third flow rate C' may be greater than a sum of twice the first flow rate A' and the second flow rate B'. That is, a relationship of C'>2A'+B' may be satisfied.

Referring to FIG. 2C, when each of the respective layers is created, a supply time period as well as the flow rate of the impurity source gas may be differently adjusted.

To form the first impurity layer 121, the impurity source gas may be supplied at the first flow rate A' for a first time period T1. Here, the first impurity layer 121 may be formed through reaction of the impurity source gas with other reaction gases.

Next, the second impurity layer 123 may be formed by supplying the impurity source gas at a second flow rate B' that is greater than the first flow rate A' for a second time period T2 that is longer than the first time period T1. As a result, the concentration of the impurity source gas in the reaction chamber may increase in proportion to the flow rate and the supply time period or in proportion to the product of these two factors. The reason of this is that the impurity source gas is supplied into the same reaction chamber at the second flow rate B' that is greater than the first flow rate A' for a longer time period. Since the concentration of the impurity source gas in the reaction chamber is higher upon formation of the second impurity layer 123 than upon formation of the first impurity layer 121, the impurity concentration of the second impurity layer 123 is also higher than the impurity concentration of the first impurity layer 121.

Next, the third impurity layer 125 may be formed by supplying the impurity source gas at the third flow rate C' that is greater than the second flow rate B' for a third time period T3 that is longer than the second time period T2. As a result, due to the reason as described above, the third impurity layer 125 having an impurity concentration that is higher than the impurity concentration of the second impurity layer 123 can be obtained.

In some embodiments, the third time period T3 may be greater than a sum of the first time period T1 and the second time period T2. That is, a relationship of T3>T1+T2 may be satisfied.

Figure 3:
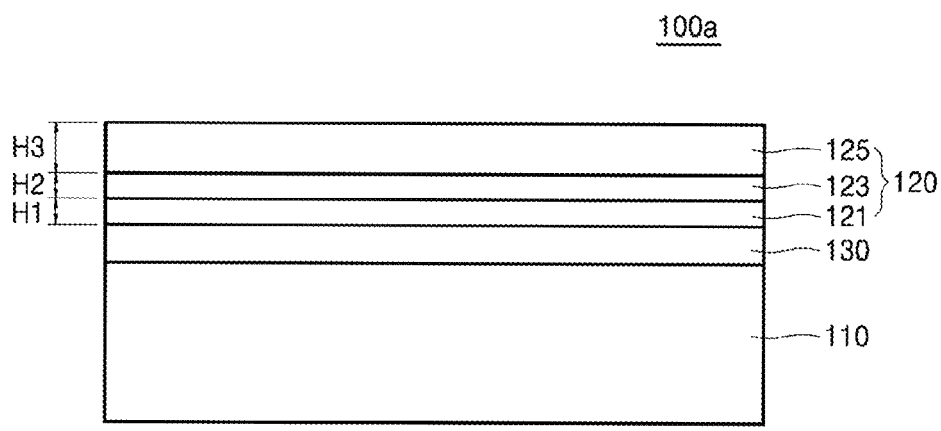
FIG. 3 is a sectional side view of a material layer stack according to an embodiment.

FIG. 3 is a sectional side view of a material layer stack 100a according to an embodiment. The material layer stack 100a shown in FIG. 3 is the same as the material layer stack 100 shown in FIG. 1 except that the material layer stack 100a further includes a buffer layer 130 between the substrate 110 and the semiconductor layer 120. Therefore, except the buffer layer 130 and matters related thereto, duplicate descriptions of the other portions will be omitted.

Referring to FIG. 3, the material layer stack 100a may further include the buffer layer 130 between the substrate 110 and the semiconductor layer 120.

The buffer layer 130 may be $In_xAl_yGa_{1-x-y}N$ (0≤x≤1, 0≤y≤1). For example, the buffer layer 130 may be GaN, AlN, AlGaN, or InGaN. The buffer layer 130 may be formed by combining a plurality of layers or by gradually changing composition of a material such as the materials set forth above, as needed. The buffer layer 130 may not be doped with an impurity such as Si or C.

The buffer layer 130 may serve to alleviate a difference between the first lattice constant of the substrate 110 and the second lattice constant of the semiconductor layer 120. In addition, the buffer layer 130 may serve to alleviate lattice defects of the semiconductor layer 120 grown thereon.

Figure 4:
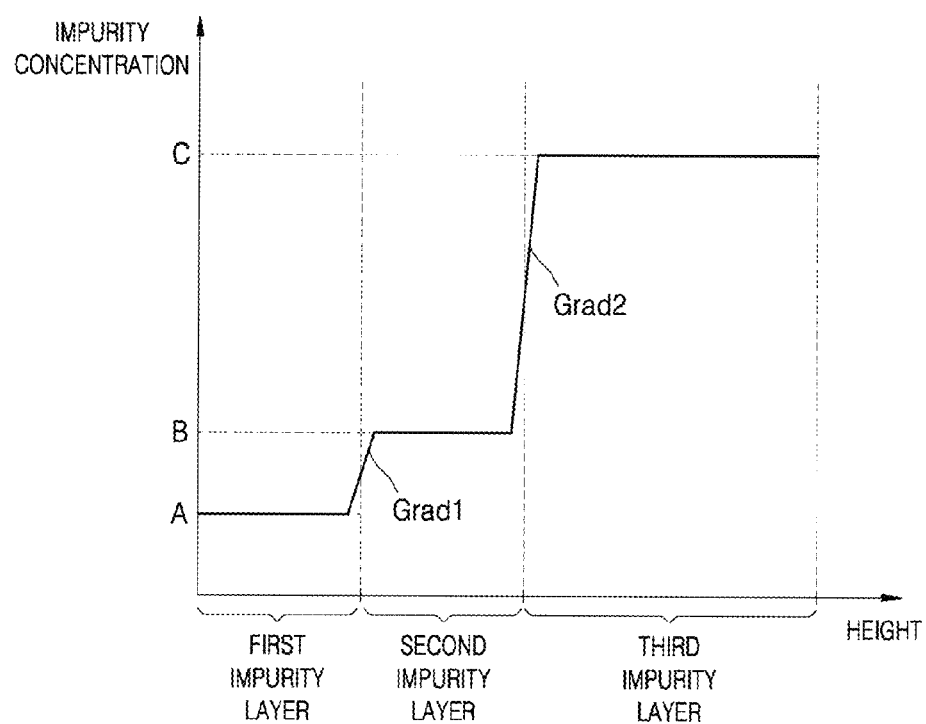
FIG. 4 is a graph conceptually depicting changes in impurity concentration according to a height of each of impurity layers in accordance with an embodiment.

FIG. 4 is a graph conceptually depicting changes in impurity concentration according to a height of each of the impurity layers 121, 123, 125 in accordance with an embodiment.

Referring to FIG. 4, the impurity concentration may change according to certain gradients Grad1, Grad2 at the interfaces between the impurity layers 121, 123, 125. That is, a portion between the first impurity layer 121 and the second impurity layer 123 may have a continuously-changing impurity concentration. In addition, a portion between the second impurity layer 123 and the third impurity layer 125 may have a continuously-changing impurity concentration.

The concentration gradients Grad1, Grad2 of the portions having the continuously-changing impurity concentrations may be defined by a rate of a change in impurity concentration with respect to a change in height.

In some embodiments, when the concentration gradient at the interface between the first impurity layer 121 and the second impurity layer 123 is defined as Grad1, and the concentration gradient at the interface between the second impurity layer 123 and the third impurity layer 125 is defined as Grad2, Grad2 may be greater than Grad1. The reason of this may be that the change in concentration (N of FIG. 2A) between the second impurity layer 123 and the third impurity layer 125 is significantly greater than the change in concentration (M of FIG. 2A) between the first impurity layer 121 and the second impurity layer 123.

In some embodiments, Grad2 may range from about 2 times to about 10 times Grad1.

When the impurity layers 121, 123, 125 adjoin one another while having concentration gradients like those in FIG. 4 at the interfaces therebetween, locations corresponding to median values of the impurity concentrations of two adjoining impurity layers among the impurity layers 121, 123, 125 are defined as boundaries therebetween. That is, a location having an impurity concentration corresponding to a median value of the impurity concentration of the first impurity layer 121 and the impurity concentration of the second impurity layer 123 may be defined as the interface between the first impurity layer 121 and the second impurity layer 123. Likewise, a location having an impurity concentration corresponding to a median value of the impurity concentration of the second impurity layer 123 and the impurity concentration of the third impurity layer 125 may be defined as the interface between the second impurity layer 123 and the third impurity layer 125.

In some embodiments, the material layer stacks 100, 100a described above may be used for a light emitting element.

When a light emitting element is fabricated using the material layer stack according to the above embodiments, the light emitting element can have a low leakage current, a low operation voltage, and an excellent luminous efficiency.

Figure 5:
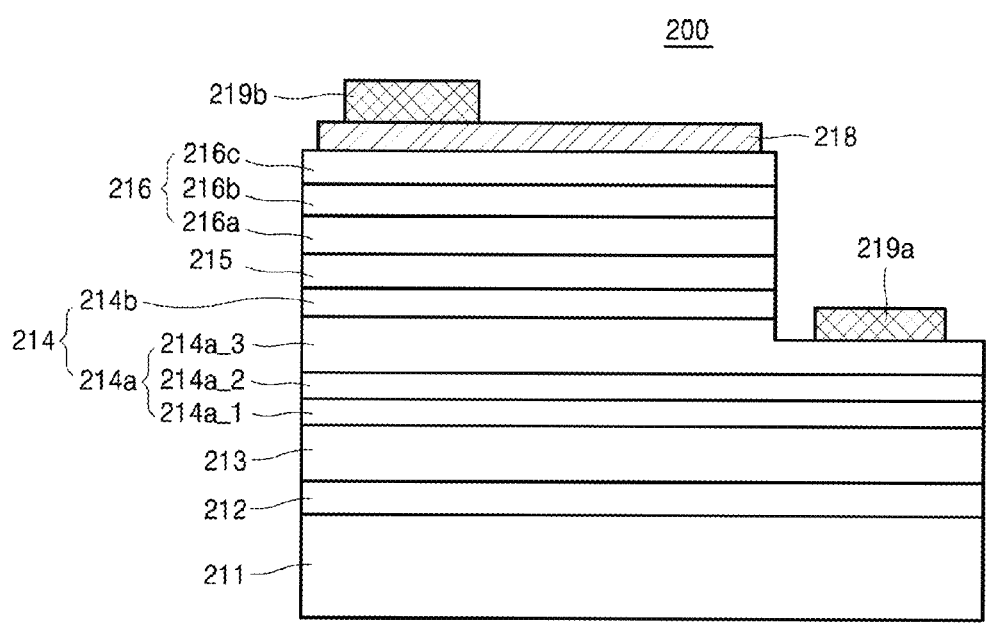
FIG. 5 is a side view conceptually showing a light emitting element according to an embodiment.

FIG. 5 is a side view conceptually showing a light emitting element 200 according to an embodiment.

Referring to FIG. 5, the light emitting element 200 may include a substrate 211, a first conductivity type semiconductor layer 214, an active layer 215, and a second conductivity type semiconductor layer 216, which are sequentially arranged on the substrate 211. A buffer layer 212 and a template layer 213 may be arranged between the substrate 211 and the first conductivity type semiconductor layer 214.

Since the substrate 211 and the buffer layer 212 are the same as the substrate 110 and the buffer layer 130 described with reference to FIGS. 1 and 3, respectively, duplicate descriptions thereof will be omitted.

The template layer 213 may be, for example, an undoped GaN layer, without being limited thereto. The template layer 213 may be formed by metal organic chemical vapor deposition (MOCVD), and may have a thickness of about 1 μm to about 3 μm.

The first conductivity type semiconductor layer 214 may be a nitride semiconductor layer which includes n-type $In_xAl_yGa_{1-x-y}N$ (0≤x<1, 0≤y<1, 0≤x+y<1). For example, the first conductivity type semiconductor layer 214 may include n-type GaN.

In the present embodiment, the first conductivity type semiconductor layer 214 may include a first conductivity type semiconductor contact layer 214a and a current diffusion layer 214b. The first conductivity type semiconductor contact layer 214a may have an impurity concentration of $1.0\times10^{17}$ cm$^{-3}$ to $2.0\times10^{19}$ cm$^{-3}$. The first conductivity type semiconductor contact layer 214a may have a thickness of 1 μm to 5 μm.

The first conductivity type semiconductor contact layer 214a may include a first impurity layer 214a_1, a second impurity layer 214a_2, and a third impurity layer 214a_3 on the buffer layer 212 in the stated order. The first impurity layer 214a_1, the second impurity layer 214a_2, and the third impurity layer 214a_3 may respectively correspond to the first impurity layer 121, the second impurity layer 123, and the third impurity layer 125, which are described with reference to FIG. 1. Therefore, duplicate descriptions thereof will be omitted.

The current diffusion layer 214b may have a structure in which a plurality of $In_xAl_yGa_{(1-x-y)}N$ (0≤x, y≤1, 0≤x+y≤1) layers having different compositions or different amounts of impurities are repeatedly stacked. For example, the current diffusion layer 214b may be an n-type super lattice layer obtained by repeatedly stacking two or more different-composition layers which include an n-type GaN layer and/or $Al_xIn_yGa_zN$ (0≤x,y,z≤1, excluding x=y=z=0) having a thickness of 1 nm to 500 nm. The current diffusion layer 214b may have an impurity concentration of $2\times10^{18}$ $cm^{-3}$ to $9\times10^{19}$ $cm^{-3}$. The current diffusion layer 214b may additionally include an insulating material layer, as needed. In some embodiments, the current diffusion layer 214b may be omitted, and in this case, the third impurity layer 214a_3 may directly contact the active layer 215 described below.

The second conductivity type semiconductor layer 216 may be a nitride semiconductor layer which includes p-type $In_xAl_yGa_{1-x-y}N$ (0≤x<1, 0≤y<1, 0≤x+y<1), and the p-type impurity may be Mg. For example, the second conductivity type semiconductor layer 216 may have a single-layer structure, or may have a multi-layer structure, which includes multiple layers having different compositions, as in the present embodiment. As shown in FIG. 5, the second conductivity type semiconductor layer 216 may include an electron blocking layer (EBL) 216a, a low-concentration p-type GaN layer 216b, and a high-concentration p-type GaN layer 216c provided as a contact layer. For example, the electron blocking layer 216a may have a structure in which a plurality of $In_xAl_yGa_{(1-x-y)}N$ layers having different compositions and thicknesses of 5 nm to 100 nm are stacked, or may be a single layer including $Al_yGa_{(1-y)}N$. The electron blocking layer 216a may have an energy band gap (Eg) which decreases with increasing distance from the active layer 215. For example, the electron blocking layer 216a may have an Al composition which decreases with increasing distance from the active layer 215.

The active layer 215 may have a multi-quantum well (MQW) structure in which a quantum well layer and a quantum barrier layer are alternately stacked. For example, the quantum well layer and the quantum barrier layer may be $In_xAl_yGa_{1-x-y}N$ (0≤x≤1, 0≤y≤1, 0≤x+y≤1) layers having different material compositions. In an embodiment, the quantum well layer may be an $In_xGa_{1-x}N$ (0<x≤1) layer, and the quantum barrier layer may be a GaN or AlGaN layer. Each of the quantum well layer and the quantum barrier layer may have a thickness of 1 nm to 50 nm. The active layer 215 is not limited to the multi-quantum well structure, and may have a single quantum well structure.

The light emitting element 200 may include a first electrode 219a arranged on the first conductivity type semiconductor layer 214, and an ohmic contact layer 218 and a second electrode 219b, which are sequentially arranged on the second conductivity type semiconductor layer 216.

The first electrode 219a may include a material such as Ag, Ni, Al, Cr, Rh, Pd, Ir, Ru, Mg, Zn, Pt, Au, or the like, without being limited thereto, and may have a single layer structure or a structure of two or more layers. The light emitting element 200 may further include a pad electrode layer on the first electrode 219a. The pad electrode layer may be a layer including at least one of materials such as Au, Ni, Sn, and the like.

The ohmic contact layer 218 may be variously realized according to chip structures. For example, when the light emitting element 200 has a flip-chip structure, the ohmic contact layer 218 may include a metal, such as Ag, Au, Al, or the like, or a transparent conductive oxide, such as ITO, ZIO, GIO, or the like. When the light emitting element 200 has an inverted structure with respect to the flip-chip structure, the ohmic contact layer 218 may include a transparent electrode. The transparent electrode may be one of a transparent conductive oxide layer and a transparent conductive nitride layer. For example, the transparent electrode may include at least one selected from among ITO (Indium Tin Oxide), ZITO (Zinc-doped Indium Tin Oxide), ZIO (Zinc Iridium Oxide), GIO (Gallium Iridium Oxide), ZTO (Zinc Tin Oxide), FTO (Fluorine-doped Tin Oxide), AZO (Aluminium-doped Zinc Oxide), GZO (Gallium-doped Zinc Oxide), $In_4Sn_3O_{12}$, and $Zn_{(1-x)}Mg_xO$ (Zinc Magnesium Oxide, 0≤x≤1). The ohmic contact layer 218 may include graphene, as needed. The second electrode 219b may include at least one of Al, Au, Cr, Ni, Ti, and Sn.

Hereinafter, the inventive concept will be explained in more detail with reference to some examples. It should be understood that these examples are provided for clear understanding of the inventive concept only and are not to be construed in any way as limiting the inventive concept.

Example 1

An undoped GaN layer was grown to a thickness of 1 μm on a sapphire substrate. Next, on the undoped GaN layer, a first impurity layer, a second impurity layer, and a third impurity layer, which had impurity concentrations of $1.5\times10^{18}$ $cm^{-3}$, $2.25\times10^{18}$ $cm^{-3}$, and $6.0\times10^{18}$ $cm^{-3}$ through Si implantation, were grown to thicknesses of 1.0 μm, 1.0 μm, and 2.0 μm, respectively.

Next, a super lattice layer, in which AlGaN and GaN were alternately stacked, and an active layer, in which GaN and InGaN were alternately stacked, were formed on the third impurity layer, and a p-GaN layer was formed on the active layer, thereby fabricating a light emitting element corresponding to the light emitting element 200 described above. A fluorescent material was dotted on a light emitting surface of the light emitting element such that white light was emitted from the light emitting surface.

Example 2

A light emitting element was fabricated in the same manner as in Example 1 except that the third impurity layer had an impurity concentration of $5.1\times10^{18}$ $cm^{-3}$.

Comparative Example 1

A light emitting element was fabricated in the same manner as in Example 1 except that an impurity layer having a doping concentration of $6.0\times10^{18}$ $cm^{-3}$ was formed to a thickness of 4.0 μm instead of the first to third impurity layers.

Turn-on voltage at 1 μA, operation voltage at 350 mA, and optical power were measured on each of the light emitting elements of Example 1, Example 2, and Comparative Example 1. In addition, when a measurement result of the light emitting element of Comparative Example 1 was defined as 100, measurement results of the light emitting elements of Example 1 and Example 2 were calculated into relative values with respect to 100.

TABLE 1

|  | Turn-on voltage | Operation voltage | Optical power |
|---|---|---|---|
| Comparative Example 1 | 100 | 100 | 100 |
| Example 1 | 101.3 | 98.8 | 100.7 |
| Example 2 | 101.1 | 99.3 | 99.7 |

As shown in Table 1, it could be seen that the light emitting elements of Example 1 and Example 2 exhibited improved turn-on voltage and operation voltage as compared with the light emitting element of Comparative Example 1. In addition, it was verified that the light emitting element of Example 1 also exhibited improved optical power.

Figure 6:
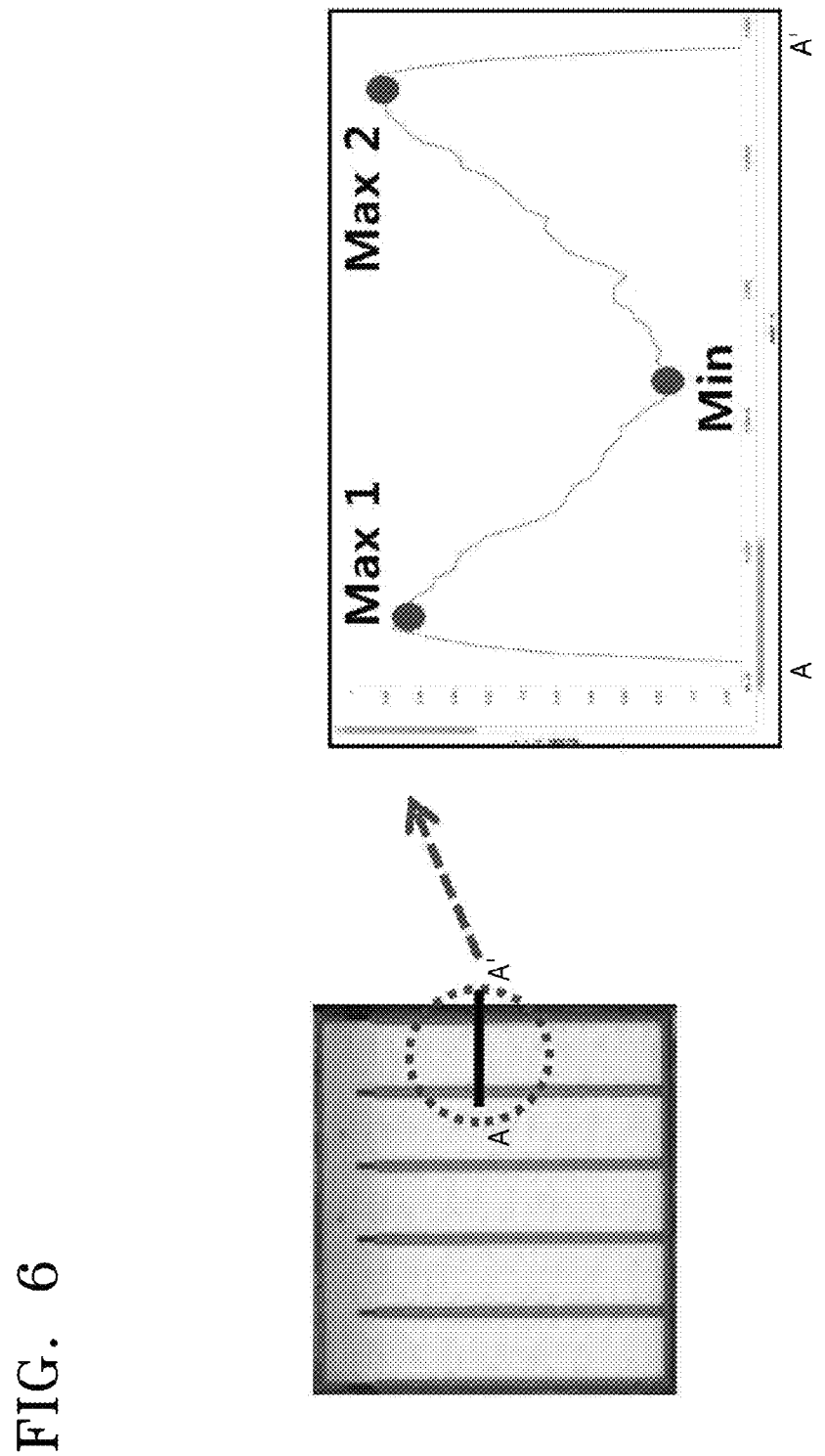
FIG. 6 shows an image and a graph, which show results of a deviation in optical power according to locations, as measured using a light emitting element of Example 1.

An optical power deviation between an area, which adjoins an electrode, and a middle area, which was located between electrodes, was measured by analyzing light emitted from each of the fabricated light emitting elements. FIG. 6 shows an image and a graph, which show results of optical power deviations according to locations, as measured using the light emitting element of Example 1.

As shown in FIG. 6, the graph shows measurement results in a portion A-A' of a light emission image of the light emitting element. It could be seen that although a point in which light emission was maximized was present in the area adjoining the electrode, light emission was minimized in the middle area between the electrodes. For the light emitting element of Example 1 and the light emitting element of Comparative Example 1, a maximum-minimum difference in optical power measured from the left electrode to the middle area and a maximum-minimum difference in optical power measured from the right electrode to the middle area were measured.

TABLE 2

|  | Max1-Min | Max2-Min |
|---|---|---|
| Comparative Example 1 | 16.8% | 18.2% |
| Example 1 | 13.3% | 16.1% |

As shown in Table 2, it could be seen that the light emitting element of Example 1 had a smaller maximum-minimum difference in optical power. This means that light is more uniformly emitted throughout the light emitting surface of the light emitting element of Example 1 compared to the light emitting element of Comparative Example 1. Even though the Si doping concentration of the third impurity layer of Example 1 was the same as the Si doping concentration of the impurity layer of Comparative Example 1, the light emitting element of Example 1 showed a difference in result from the light emitting element of Comparative Example 1. It is supposed that this difference in result was due to unexpected effects obtained by use of doping concentrations and thicknesses of the first to third impurity layers according to the embodiments.

Figure 7A:
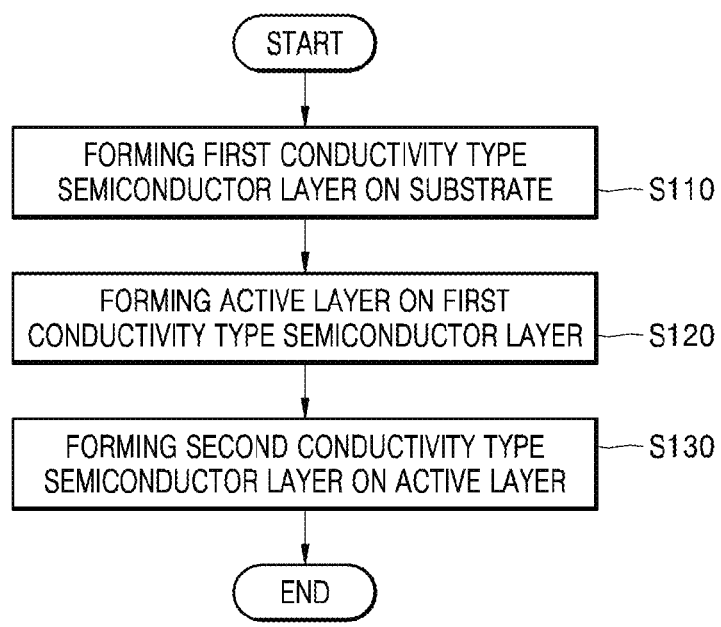
FIGS. 7A and 7B are flow charts for explaining a method of fabricating a light emitting element according to an embodiment.
Figure 7B:
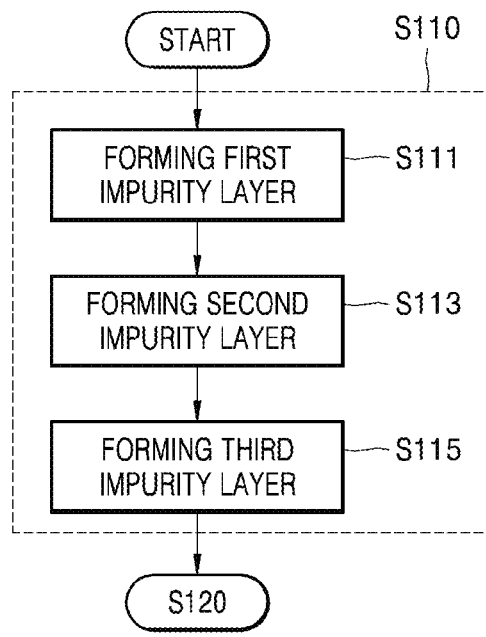
Figure 8A:
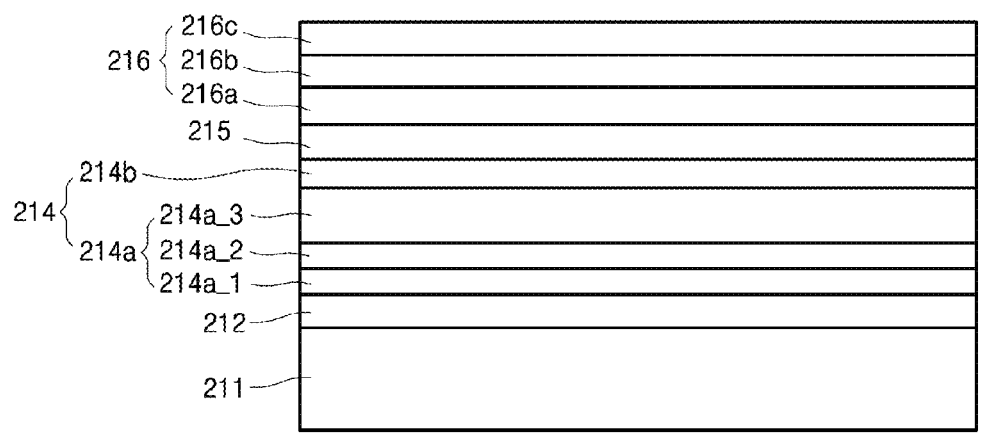
FIGS. 8A to 8C are sectional side views for explaining a method of fabricating a light emitting element according to an embodiment stage by stage.
Figure 8B:
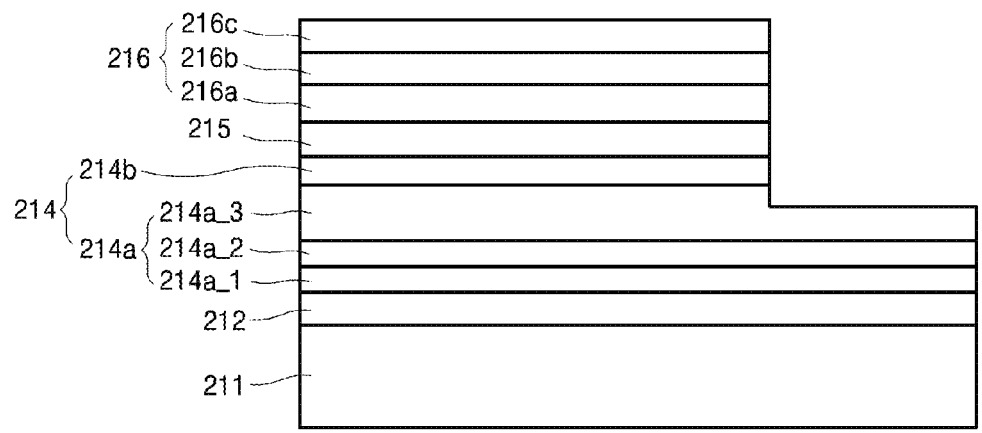
Figure 8C:
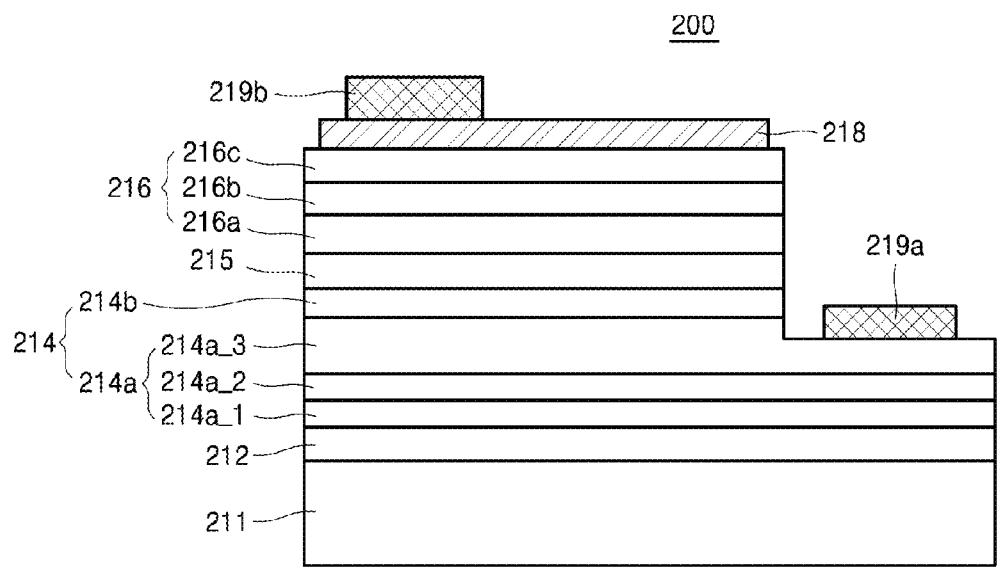

FIGS. 7A and 7B are flow charts for explaining a method of fabricating a light emitting element according to an embodiment. FIGS. 8A to 8C are sectional side views for explaining a method of fabricating a light emitting element according to an embodiment stage by stage.

Referring to FIGS. 7A, 7B, and 8A, the first conductivity type semiconductor layer 214 may be formed on the substrate 211 (S110).

Since forming the buffer layer 212 on the substrate 211 have been described in detail with reference to FIGS. 1 and 5, additional descriptions thereof will be omitted.

The first impurity layer 214a_1, the second impurity layer 214a_2, and the third impurity layer 214a_3 may be sequentially formed on the buffer layer 212 (S111, S113, S115). To form the first impurity layer 214a_1, the second impurity layer 214a_2, and the third impurity layer 214a_3, for example, a method such as metal organic chemical vapor deposition (MOCVD), molecular beam epitaxy (MBE), hydride vapor phase epitaxy (HVPE), or the like may be used. However, the inventive concept is not limited to these methods.

When an impurity layer doped with an impurity such as silicon (Si) is formed, for example, using MOCVD methods, a doping concentration of Si may be adjusted by controlling a supply rate of a Si precursor.

In some embodiments, when a doping concentration of an impurity needs to be increased along with sequentially forming the first impurity layer 214a_1, the second impurity layer 214a_2, and the third impurity layer 214a_3, a supply rate of a precursor of the impurity may be increased in forming each of the impurity layers. That is, the supply rate of the Si precursor in the process of forming the second impurity layer 214a_2 may be greater than the supply rate of the Si precursor in the process of forming the first impurity layer 214a_1. In addition, the supply rate of the Si precursor in the process of forming the third impurity layer 214a_3 may be greater than the supply rate of the Si precursor in the process of forming the second impurity layer 214a_2. In some embodiments, the supply rate of the Si precursor in the process of forming the third impurity layer 214a_3 may be greater than two times the supply rate of the Si precursor in the process of forming the second impurity layer 214a_2.

Since crystallinity and surface uniformity are deteriorated with increasing impurity concentration, crystallinity and surface uniformity of the first impurity layer 214a_1 may be superior to crystallinity and surface uniformity of the second impurity layer 214a_2. In addition, crystallinity and surface uniformity of the second impurity layer 214a_2 may be superior to crystallinity and surface uniformity of the third impurity layer 214a_3.

The current diffusion layer 214b and the active layer 215 may be sequentially formed on the first conductivity type semiconductor contact layer 214a (S120). The active layer 215 may have a multi-quantum well structure. For example, the active layer 215 may include $In_xAl_yGa_{1-x-y}N$ ($0 \le x \le 1$, $0 \le y \le 1$, $0 \le x_+y \le 1$) layers having different compositions.

The second conductivity type semiconductor layer 216 may be formed on the active layer 215 (S130). The second conductivity type semiconductor layer 216 may include the electron blocking layer (EBL) 216a, the low-concentration p-type GaN layer 216b, and the high-concentration p-type GaN layer 216c. These layers may also be formed, for example, by a method such as MOCVD, MBE, HVPE, or the like.

Referring to FIG. 8B, a recessed region may be formed in a portion of the stacked structure formed as described above, thereby isolating the stacked structure by individual element units. A portion of the first conductivity type semiconductor layer 214 may be used as an element isolation region by the recessed region. The recessed region may be formed using an appropriate etching process, such as inductive coupled plasma reactive ion etching (ICP-RIE) or the like, which is known in the art.

Referring to FIG. 8C, the first electrode 219a and the second electrode 219b may be respectively formed over or on the first conductivity type semiconductor layer 214 and the second conductivity type semiconductor layer 216.

Figure 9A:
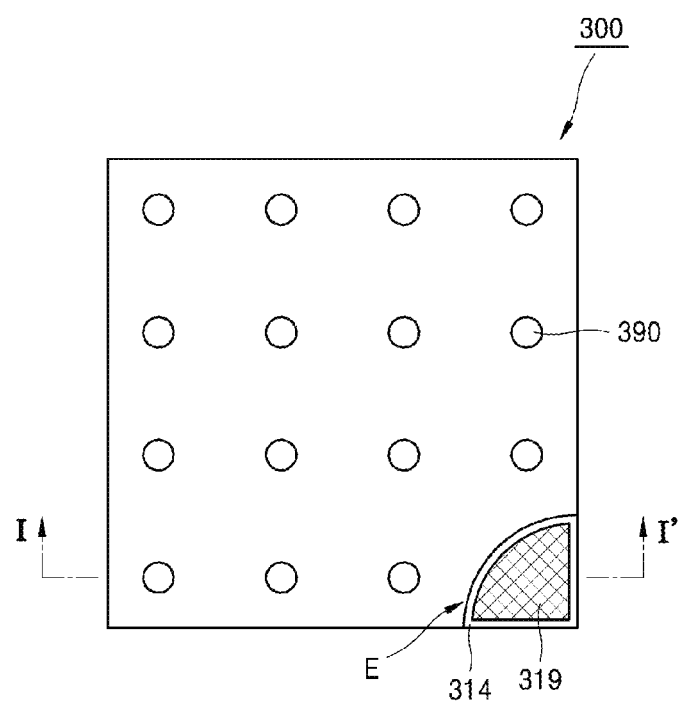
FIG. 9A is a plan view of an example of a semiconductor light emitting element applicable to the inventive concept.
Figure 9B:
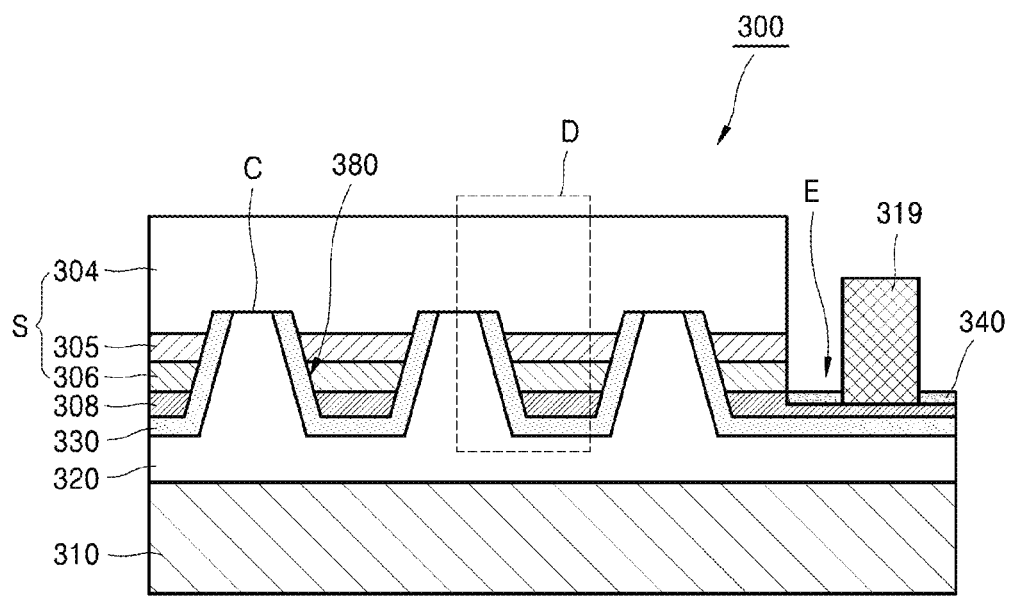
FIG. 9B is a sectional side view of the semiconductor light emitting element of FIG. 9A, taken along a line I-I' in FIG. 9A.
Figure 9C:
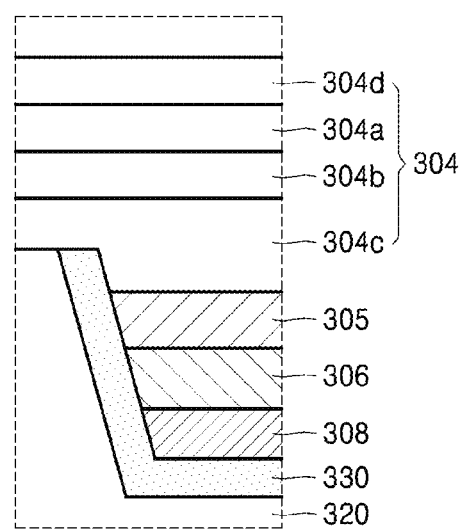
FIG. 9C is an enlarged view of a portion D in FIG. 9B.

FIG. 9A is a plan view of an example of a semiconductor light emitting element 300 applicable to the inventive concept, FIG. 9B is a sectional side view of the semiconductor light emitting element 300 of FIG. 9A, taken along a line I-I' in FIG. 9A, and FIG. 9C is an enlarged view of a portion D in FIG. 9B.

The semiconductor light emitting element 300 shown in FIGS. 9A and 9B may have a large area structure for high power for use of illumination. The semiconductor light emitting element 300 has a structure for improving a current dispersion efficiency and a heat dissipation efficiency.

The semiconductor light emitting element 300 includes a light emitting stack S, a first electrode 320, an insulating layer 330, a second electrode 308, and a substrate 310. The light emitting stack S includes a first conductivity type semiconductor layer 304, an active layer 305, a second conductivity type semiconductor layer 306, which are sequentially stacked. In addition, the light emitting stack S may be fabricated using a chemical vapor phase deposition apparatus 100.

Referring to FIG. 9C, the first conductivity type semiconductor layer 304 may have a structure in which a first impurity layer 304a, a second impurity layer 304b, and a third impurity layer 304c are sequentially stacked. In some embodiments, the first conductivity type semiconductor layer 304 may further include an undoped GaN layer 304d. Since details of the first impurity layer 304a, the second impurity layer 304b, and the third impurity layer 304c have been described with reference to FIG. 1, duplicate descriptions thereof will be omitted.

The first electrode 320 may include one or more contact holes 380, which extend to at least a portion of the first conductivity type semiconductor layer 304 while electrically insulated from the second conductivity type semiconductor layer 306 and the active layer 305, in order to be electrically connected to the first conductivity type semiconductor layer 304. The contact hole 380 may extend from an interface of the first electrode 320 to an inside of the first conductivity type semiconductor layer 304 through the second electrode 308, the second conductivity type semiconductor layer 306, and the active layer 305. The contact hole 380 may be formed using an etching process, for example, ICP-RIE or the like.

The insulating layer 330 for electrically insulating the first electrode 320 from other regions except the substrate 310 and the first conductivity type semiconductor layer 304 is formed on the first electrode 320. As shown in FIG. 9B, the insulating layer 330 is formed on a sidewall of the contact hole 380 as well as between the first electrode 320 and the second electrode 308. Thus, the first electrode 320 may be insulated from the second electrode 308, the second conductivity type semiconductor layer 306, and the active layer 305, which are exposed on the sidewall of the contact hole 380. The insulating layer 330 may be formed by depositing an insulating material such as $SiO_2$, $SiO_xN_y$, or $Si_xN_y$.

A contact region C of the first conductivity type semiconductor layer 304 is exposed by the contact hole 380, and a portion of the first electrode 320 may contact the contact region C through the contact hole 380. Thus, the first electrode 320 may be connected to the first conductivity type semiconductor layer 304.

The contact hole 380 may be appropriately adjusted to reduce a contact resistance in terms of a number, a shape, a pitch, contact diameters (or contact areas) with the first and second conductivity type semiconductor layers 304, 306, or the like (see FIG. 9A). In addition, the contact holes 380 may be arranged in various shapes along rows and columns, thereby improving current flow. The number and contact areas of conductive vias may be adjusted such that the area of the contact region C ranges from 0.1% to 20% of the planar area of the light emitting stack S. For example, the area of the contact region C ranges from 0.5% to 15%, specifically, from 0.5% to 15% of the planar area of the light emitting stack S. If the area of the contact region C is less than 0.1% of the planar area of the light emitting stack S, luminescent properties of the semiconductor light emitting element 300 are deteriorated due to non-uniform current dispersion, and if the area of the contact region C is increased to 20% or more of the planar area of the light emitting stack S, luminescent properties and brightness of the semiconductor light emitting element 300 may be deteriorated due to relative reduction in light emitting area.

A radius of a region of the conductive via, which is in contact with the first conductivity type semiconductor layer 304, may range, for example, from 1 μm to 50 μm, and the number of conductive vias may range from 1 to 48000 per light emitting stack region, depending upon the area of the light emitting stack region. Although varying with the area of the light emitting stack region, the number of conductive vias may range, for example, from 2 to 45000, specifically from 5 to 40000, more specifically from 10 to 35000 per light emitting stack region. The conductive vias may form a matrix structure of rows and columns, and in this case, a distance between the conductive vias may range from 10 μm to 1000 μm, for example, from 50 μm to 700 μm, specifically from 100 μm to 500 μm, more specifically from 150 μm to 400 μm.

If the distance between the conductive vias is less than 10 μm, since the number of conductive vias is increased, and the light emitting area is relatively reduced, a luminous efficiency of the semiconductor light emitting element 300 is deteriorated. In addition, if the distance between the conductive vias is greater than 1000 μm, the luminous efficiency may be deteriorated due to difficult current diffusion. A depth of the conductive via may vary with thicknesses of the second conductivity type semiconductor layer 306 and the active layer, and may range, for example, from 0.1 μm to 5.0 μm.

The second electrode 308 extends to an outside of the light emitting stack S to provide an exposed electrode forming region E, as shown in FIG. 9B. The electrode forming region E may include an electrode pad 319 for connecting the second electrode 308 to an external power supply outside the semiconductor light emitting element 300. Although one electrode forming region E is shown in FIG. 9A, the semiconductor light emitting element 300 may include a plurality of electrode forming regions E, as needed. The electrode forming region E may be formed in a corner of the semiconductor light emitting element 300 in order to maximize the light emitting area, as shown in FIG. 9A.

In the present embodiment, an etch-stop-purpose insulating layer 340 may be arranged around the electrode pad 319. The etch-stop-purpose insulating layer 340 may be formed in the electrode forming region E after the light emitting stack S is formed and before the second electrode 308 is formed, and may act as an etch stop layer when an etching process for forming the electrode forming region E is performed.

The second electrode 308 may include a material which has high reflectivity while forming ohmic contact to the second conductivity type semiconductor layer 306. The second electrode 308 may include a reflective electrode material.

Figure 10:
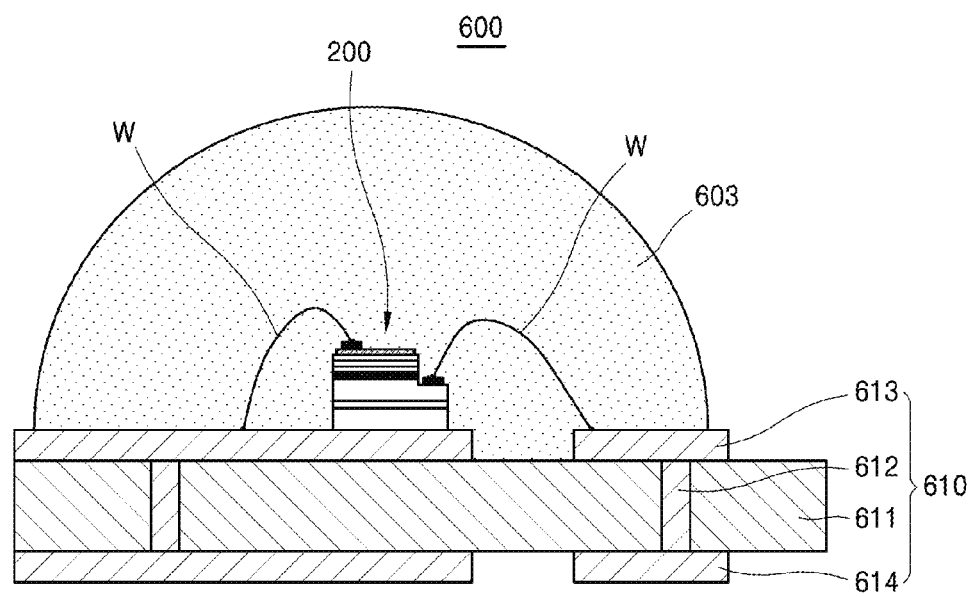
FIG. 10 is a sectional view of a package including the light emitting element shown in FIG. 5, as an example applicable to the inventive concept.

FIG. 10 is a sectional view of a package 600 including the light emitting element 200 shown in FIG. 5, as an example applicable to the inventive concept.

The semiconductor light emitting element package 600 shown in FIG. 10 may include the semiconductor light emitting element 200 shown in FIG. 5, a mounting substrate 610, and an encapsulant 603. The semiconductor light emitting element 200 may be mounted on the mounting substrate 610 and electrically connected to the mounting substrate 610 via a wire W. The mounting substrate 610 may include a substrate body 611, an upper electrode 613, a lower electrode 614, and a through-electrode 612 connecting the upper electrode 613 to the lower electrode 614. The substrate body 611 may include a resin, ceramic, or a metal, and the upper and lower electrodes 613, 614 may be metal layers such as Au, Cu, Ag, or Al layers. For example, the mounting substrate 610 may be a substrate such as PCB, MCPCB, MPCB, FPCB, or the like, and may have various structures.

The encapsulant 603 may be formed in a dome-shaped lens structure having a convex upper surface. However, according to embodiments, the encapsulant 603 may be formed in a lens structure having a convex or concave upper surface, thereby adjusting a beam angle of light emitted through the upper surface of the encapsulant 603.

Figure 11A:
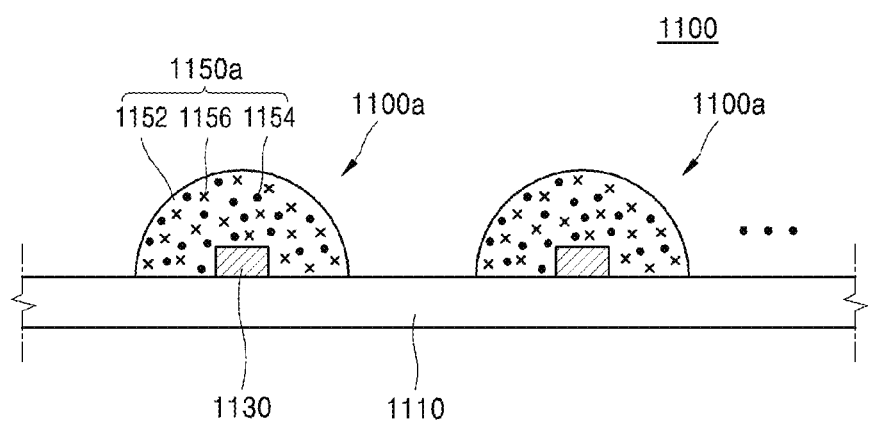
FIGS. 11A and 11B are schematic sectional views of white light source modules according to embodiments.
Figure 11B:
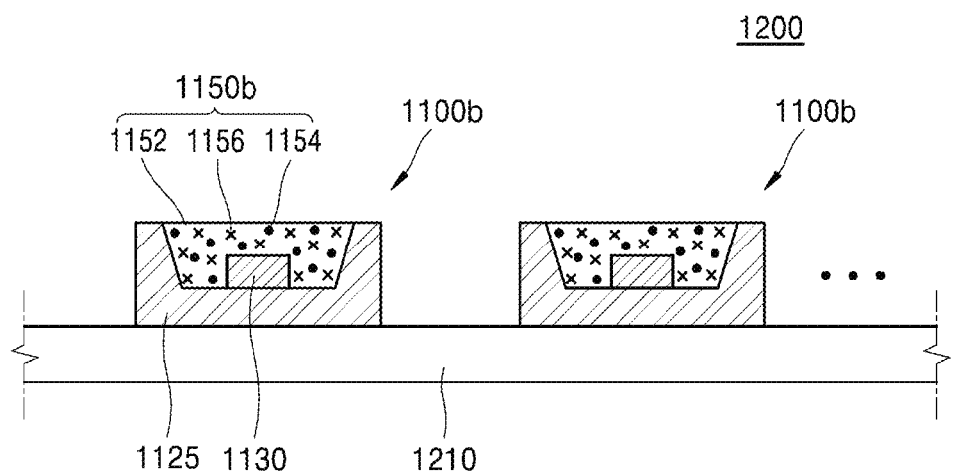

FIGS. 11A and 11B are schematic sectional views of white light source modules 1100, 1200 according to embodiments.

Referring to FIG. 11A, the white light source module 1100 may include a circuit board 1110, and a plurality of white light emitting devices 1100a mounted on the circuit board 1110. A conductive pattern, which is connected to the white light emitting devices 1100a, may be formed on an upper surface of the circuit board 1110.

Each of the white light emitting devices 1100a may have a structure in which a light emitting element 1130 emitting blue light is directly mounted on the circuit board 1110 in a chip-on-board (COB) manner. Each of the white light emitting devices 1100a does not have a separate reflective wall. In addition, each of the white light emitting devices 1100a includes a wavelength converter 1150a having a semi-spherical shape to function as a lens, and thus can have a wide beam angle. Such a wide beam angle may contribute to reducing a thickness or width of an LCD display.

Referring to FIG. 11B, the white light source module 1200 may include a circuit board 1210, and a plurality of white light emitting devices 1100b mounted on the circuit board 1210. Each of the white light emitting devices 1100b may include a light emitting element 1130, which is mounted in a reflective cup of a package body 1125 and emits blue light, and a wavelength converter 1150b encapsulating the light emitting element 1130.

The light emitting element 1130 may be the light emitting element 200 described with reference to FIG. 5.

The wavelength converters 1150a, 1150b may contain a wavelength converting material such as a phosphor and/or a quantum dot, as needed.

Figure 12A:
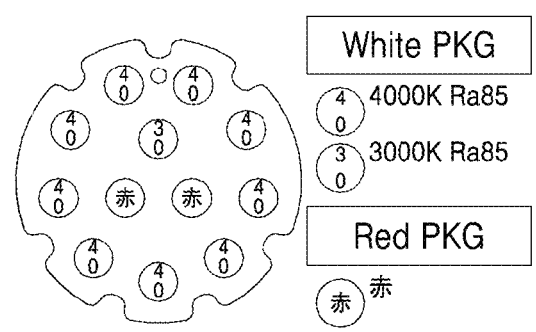
FIGS. 12A and 12B show schematic diagrams of white light source modules applicable to an illumination device.
Figure 12B:
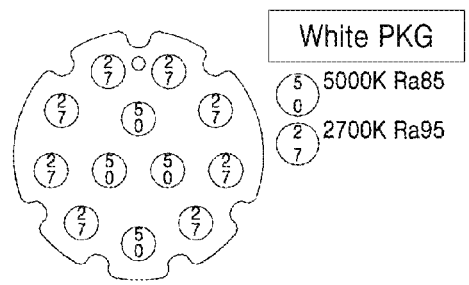

FIGS. 12A and 12B show schematic diagrams of white light source modules applicable to an illumination device.

Each of the light source modules shown in FIGS. 12 (A) and 12 (B) may include a plurality of light emitting element packages mounted on a circuit board. The plurality of light emitting element packages mounted on one light source module may include homogeneous packages generating light of the same wavelengths, or alternatively, as in the present embodiment, may include heterogeneous packages generating light of different wavelengths.

Referring to FIG. 12A, the white light source module may include a combination of white light emitting element packages 40, 30 respectively having color temperatures of 4000K and 3000K and a red light emitting element package. The white light source module may be adjusted to a color temperature of 3000K to 4000K, and may provide white light having a color rendering index Ra of 85 to 100.

In another embodiment, the white light source module may include white light emitting element packages only, and some of the packages may emit white light different color temperatures. For example, as shown in FIG. 12B, a white light emitting element package 27 having a color temperature of 2700K and a white light emitting element package 50 having a color temperature of 5000K are combined, thereby providing white light which can be adjusted to a color temperature of 2700K to 5000K and has a color rendering index Ra of 85 to 99. Here, the number of light emitting element packages having each color temperature may mainly vary with basic set values of color temperatures. For example, in an illumination device having a basic set value of a color temperature of around 4000K, the number of packages corresponding to a color temperature of 4000K may be greater than the number of packages corresponding to a color temperature of 3000K, or the number of red light emitting element packages.

As such, a heterogeneous light emitting element package includes a light emitting element, which emits white light by combining a blue light emitting element with a yellow, green, red, or orange phosphor, and at least one of violet, blue, green, red, and infrared light emitting elements, thereby adjusting a color temperature and a color rendering index (CRI) of white light.

Figure 19:
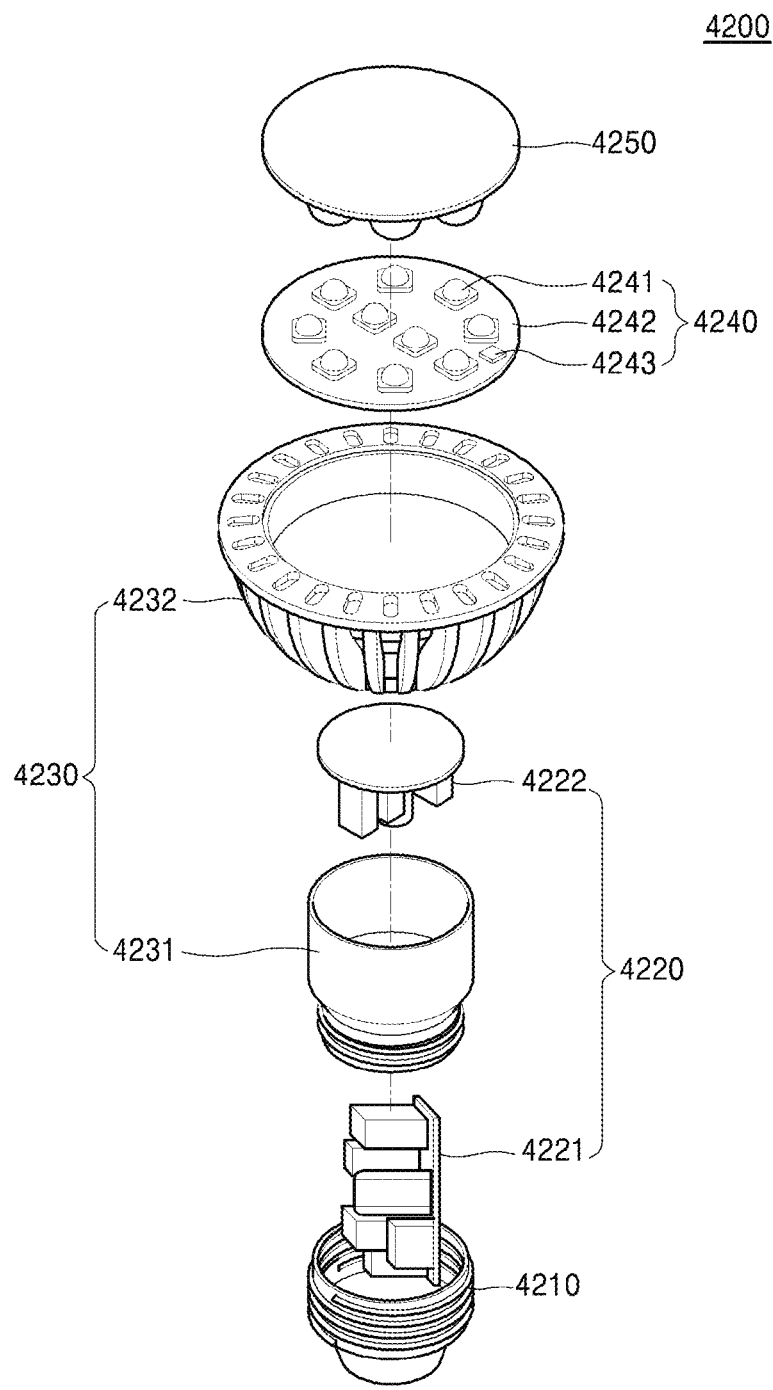
FIG. 19 is a schematic exploded perspective view showing a bulb type lamp as an illumination device according to an embodiment.
Figure 21:
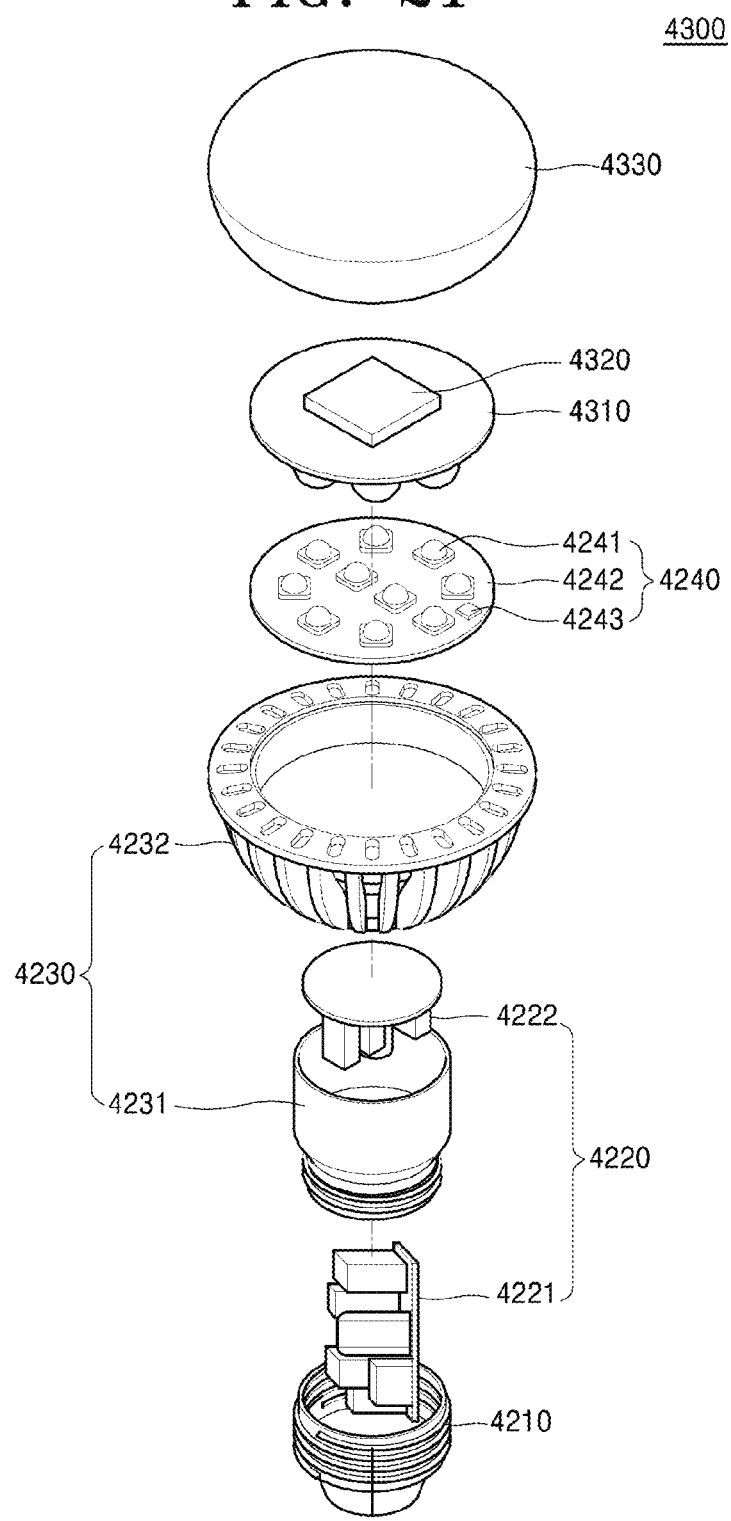
FIG. 21 is a schematic exploded perspective view showing a lamp, which includes a communication module, as an illumination device according to an embodiment.

The white light source modules set forth above may be used as a light source module 4240 of a bulb type illumination device (4200 in FIG. 19 or 4300 in FIG. 21).

In a single light emitting element package, light of a desired color is determined based on a wavelength of a light emitting diode (LED) chip, which is a light emitting element, and a kind and a mixing proportion of a phosphor. In addition, in the case of white light, a color temperature and a color rendering index of the white light may be adjusted.

For example, when an LED chip emits blue light, a light emitting element package including at least one of yellow, green, and red phosphors may emit white light of various color temperatures according to a mixing proportion of a phosphor. Alternatively, a light emitting element package, in which a green or red phosphor is applied to a blue LED chip, may emit green or red light. As such, a light emitting element package emitting white light may be combined with a package emitting green or red light, thereby adjusting a color temperature and a color rendering index of white light.

In addition, the light emitting element package may include at least one of light emitting elements emitting violet, blue, green, red, and infrared light.

In this case, an illumination device including the light emitting element package may be adjusted to a color rendering index of a sodium (Na) lamp level to a solar level. In addition, the illumination device may generate various white light having a color temperature of about 1500K to about 20000K, and if necessary, the illumination device can adjust an illumination color according to an ambient atmosphere or mood by generating visible light, which has a violet, blue, green, red, or orange color, or infrared light. Further, the illumination device may generate light of a special wavelength capable of promoting growth of plants.

Figure 13:
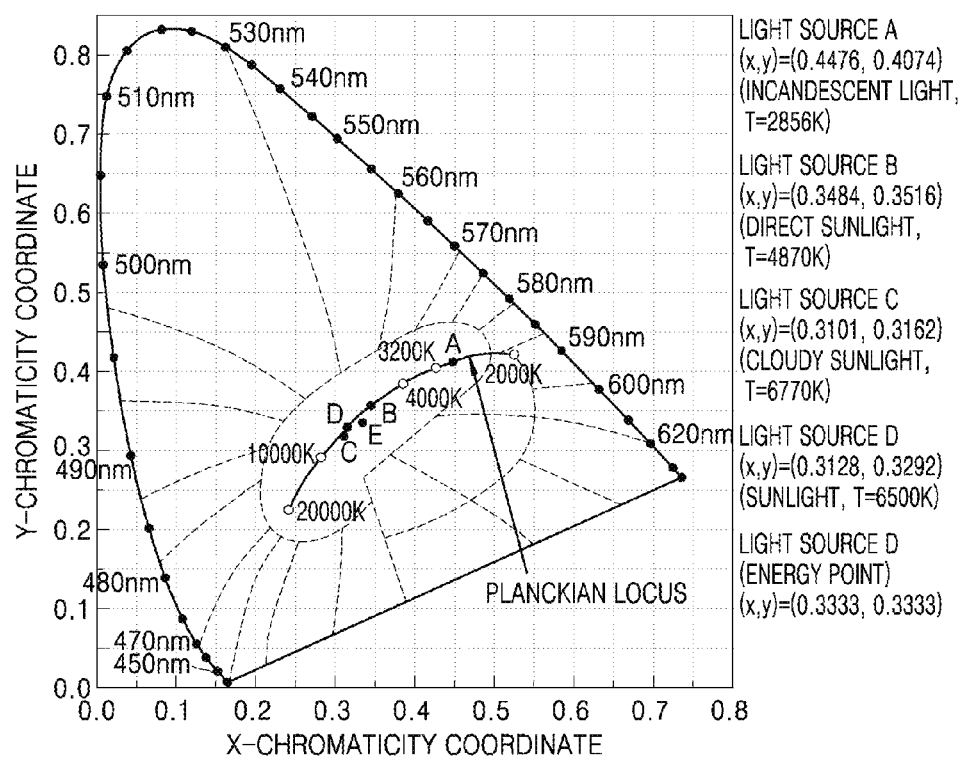
FIG. 13 shows an example of a color temperature spectrum of light emitted by a light emitting element according to an embodiment.

White light obtained by combining a blue light emitting element with a yellow, green, or red phosphor and/or a green or red light emitting element may have two or more peak wavelengths, and may be positioned on a line segment defined by (x, y) coordinates of (0.4476, 0.4074), (0.3484, 0.3516), (0.3101, 0.3162), (0.3128, 0.3292), and (0.3333, 0.3333) in a CIE 1931 coordinate system, as shown in FIG. 13. Alternatively, the white light may be positioned in a region that is surrounded by the line segment and a black body radiation spectrum. A color temperature of the white light may range from 1500K to 20000K.

Various materials such as a phosphor and/or a quantum dot may be used as a material for converting a wavelength of light emitted from a semiconductor light emitting element.

The phosphor may have the following empirical formulae and colors.

Oxide-based phosphor: Yellow and Green $Y_3Al_5O_{12}$:Ce, $Tb_3Al_5O_{12}$:Ce, $Lu_3Al_5O_{12}$:Ce Silicate-based phosphor: Yellow and Green $(Ba,Sr)_2SiO_4$:Eu, Yellow and Orange $(Ba,Sr)_3SiO_5$:Ce Nitride-based phosphor: Green β-SiAlON:Eu, Yellow $La_3Si_6N_{11}$:Ce, Orange α-SiAlON:Eu, Red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-z-y}$ (0.5≤x≤3, 0<z<0.3, 0<y≤4)—Formula (1)

Here, in Formula (1), Ln may be at least one selected from the group consisting of Group IIIA elements and rare-earth elements, and M may be at least one selected from the group consisting of Ca, Ba, Sr, and Mg.

Fluoride-based phosphor: KSF-based Red $K_2SiF_6$:$Mn^{4+}$, $K_2TiF_6$:$Mn^{4+}$, $NaYF_4$:$Mn^{4+}$, $NaGdF_4$:$Mn^{4+}$ (for example, a proportion of Mn may have a range of 0<z≤0.17)

Composition of the phosphor should accord with stoichiometry, and each element can be substituted with another element in a group of the periodic table, to which the element belongs. For example, Sr can be substituted with Ba, Ca, Mg, or the like of the alkali earth group (Group II), and Y can be substituted with Tb, Lu, Sc, Gd, or the like of the lanthanide series. In addition, Eu or the like, which is an activator, can be substituted with Ce, Tb, Pr, Er, Yb, or the like according to a desired energy level. Further, the activator may be used alone, or may be used in conjunction with a sub-activator or the like in order to modify properties of the phosphor.

In particular, the fluoride-based red phosphor may be coated with fluoride, which does not contain Mn, for improvement of reliability at high temperature/high humidity, or may further include an organic coating on a surface of the phosphor or on a fluoride coating surface not containing Mn. Since the fluoride-based red phosphor can realize a narrow full width at half maximum (FWHM) of 40 nm or less unlike other phosphors, the fluoride-based red phosphor can be used for high-resolution TVs such as UHD TVs.

Table 3 shows phosphors according to applications of white light emitting elements using LED chips (wavelength: 440 nm to 460 nm) or UV LED chips (wavelength: 380 nm to 440 nm)

TABLE 3

| Purpose | Phosphor |
|---|---|
| LED TV BLU | β-SiAlON:$Eu^{2+}$ <br> (Ca,Sr)$AlSiN_3$:$Eu^{2+}$ <br> $La_3Si_6O_{11}$:$Ce^{3+}$ <br> $K_2SiF_6$:$Mn^{4+}$ <br> $K_2TiF_6$:$Mn^{4+}$ <br> $NaYF_4$:$Mn^{4+}$ <br> $NaGdF_4$:$Mn^{4+}$ <br> $SrLiAl_3N_4$:Eu <br> $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4) (1) |
| Illumination | $Lu_3Al_5O_{12}$:$Ce^{3+}$ <br> Ca-α-SiAlON:$Eu^{2+}$ <br> $La_3Si_6N_{11}$:$Ce^{3+}$ <br> (Ca,Sr)$AlSiN_3$:$Eu^{2+}$ <br> $Y_3Al_5O_{12}$:$Ce^{3+}$ <br> $K_2SiF_6$:$Mn^{4+}$ <br> $K_2TiF_6$:$Mn^{4+}$ <br> $NaYF_4$:$Mn^{4+}$ <br> $NaGdF_4$:$Mn^{4+}$ <br> $SrLiAl_3N_4$:Eu <br> $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4) (1) |
| Side view (Mobile, Note PC) | $Lu_3Al_5O_{12}$:$Ce^{3+}$ <br> Ca-α-SiAlON:$Eu^{2+}$ <br> $La_3Si_6N_{11}$:$Ce^{3+}$ <br> (Ca,Sr)$AlSiN_3$:$Eu^{2+}$ <br> $Y_3Al_5O_{12}$:$Ce^{3+}$ <br> (Sr,Ba,Ca,Mg)$_2SiO_4$:$Eu^{2+}$ <br> $K_2SiF_6$:$Mn^{4+}$ <br> $K_2TiF_6$:$Mn^{4+}$ <br> $NaYF_4$:$Mn^{4+}$ <br> $NaGdF_4$:$Mn^{4+}$ <br> $SrLiAl_3N_4$:Eu <br> $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4) (1) |
| Electronics (Head Lamp, etc.) | $Lu_3Al_5O_{12}$:$Ce^{3+}$ <br> Ca-α-SiAlON:$Eu^{2+}$ <br> $La_3Si_6N_{11}$:$Ce^{3+}$ <br> (Ca,Sr)$AlSiN_3$:$Eu^{2+}$ <br> $Y_3Al_5O_{12}$:$Ce^{3+}$ <br> $K_2SiF_6$:$Mn^{4+}$ <br> $K_2TiF_6$:$Mn^{4+}$ <br> $NaYF_4$:$Mn^{4+}$ <br> $NaGdF_4$:$Mn^{4+}$ <br> $SrLiAl_3N_4$:Eu <br> $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4) (1) |

In addition, wavelength converting materials such as a quantum dot (QD) may be used as the wavelength converter instead of or in conjunction with the phosphor.

Figure 14:
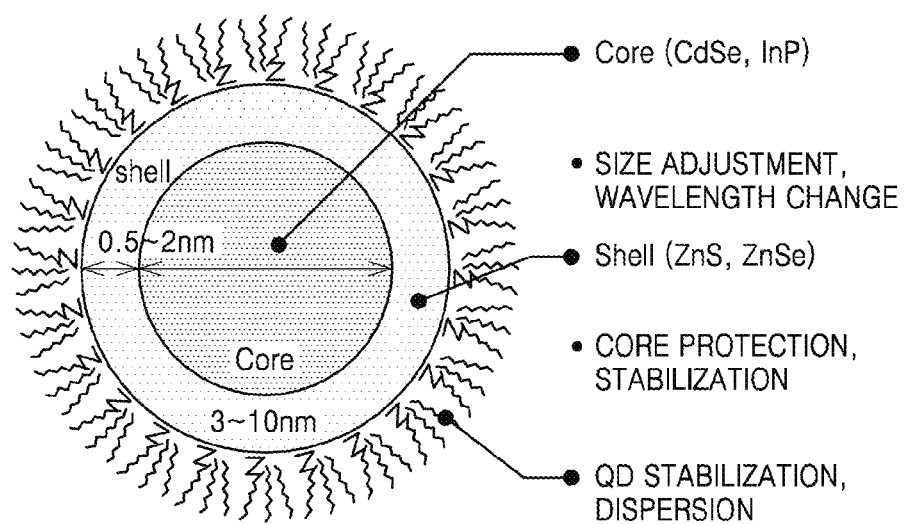
FIG. 14 is a schematic diagram showing a sectional structure of a quantum dot (QD)

FIG. 14 is a schematic diagram showing a sectional structure of a quantum dot (QD). The quantum dot (QD) may have a core-shell structure using a Group III-V or Group II-VI compound semiconductor. For example, the quantum dot may have a core such as CdSe, InP, or the like, and a shell such as ZnS, or ZnSe. In addition, the quantum dot may include a ligand for stabilizing the core and the shell. For example, the core may have a diameter of 1 nm to 30 nm, specifically 3 nm to 10 nm. The shell may have a thickness of 0.1 nm to 20 nm, specifically 0.5 nm to 2 nm.

The quantum dot can realize various colors according to sizes. In particular, when used as a substitute for a phosphor, the quantum dot can substitute for a red or green phosphor. When used, the quantum dot can realize a narrow full width at half maximum (for example, about 35 nm).

The wavelength converting material may be contained in the encapsulant (see FIGS. 10, 11A, and 11B). Alternatively, the wavelength converting material, which is manufactured in a film shape in advance, may be attached to a surface of an optical structure such as an LED chip or a light guide plate. In this case, the wavelength converting material may be easily applied to a desired region while having a uniform thickness.

Figure 15:
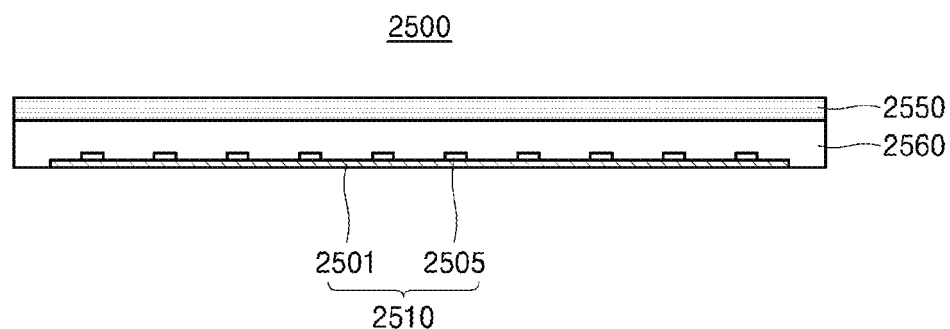
FIGS. 15, 16A, and 16B are schematic sectional views of backlight units according to various embodiments.
Figure 16A:
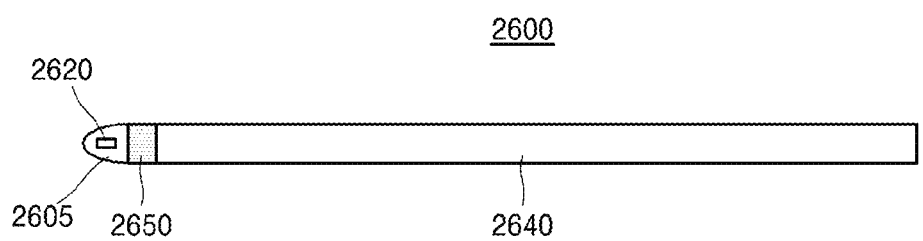
Figure 16B:
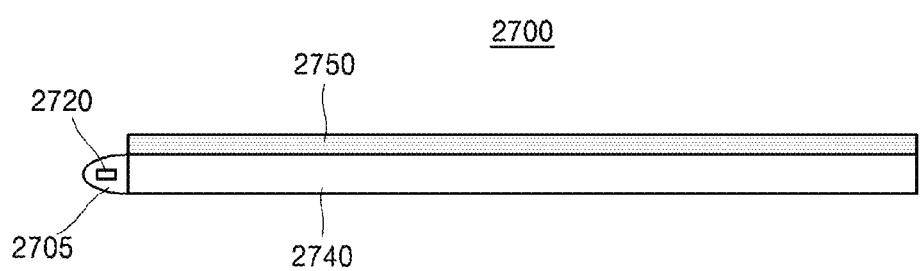

FIGS. 15, 16A, and 16B are schematic sectional views of backlight units 2500, 2600, 2700 according to various embodiments.

In the backlight units 2500, 2600, 2700 of FIGS. 15, 16A, and 16B, wavelength converters 2550, 2650, 2750 may be arranged in the backlight units 2500, 2600, 2700 outside light sources 2505, 2605, 2705 instead of being arranged in the light sources 2505, 2605, 2705, respectively, and may convert light.

Referring to FIG. 15, the backlight unit 2500, which is a direct-type backlight unit, may include the wavelength converter 2550, a light source module 2510 on a lower side of the wavelength converter 2550, and a bottom case 2560 accommodating the light source module 2510. In addition, the light source module 2510 may include a printed circuit board 2501 and a plurality of light sources 2505 mounted on an upper surface of the printed circuit board 2501. The light sources 2505 may be one of the light source modules 1100, 1200 of FIGS. 11A and 11B, in which wavelength materials are omitted from the wavelength converters 1150a, 1150b.

In the backlight unit 2500 according to the present embodiment, the wavelength converter 2550 may be arranged on an upper side of the bottom case 2560. Therefore, at least a portion of light emitted from the light source module 2510 may be subjected to wavelength conversion by the wavelength converter 2550. The wavelength converter 2550 may be applied in the form of a film that is separately manufactured. Alternatively, the wavelength converter 2550 may be provided in the form of one body obtained by combining the wavelength converter 2550 with a light diffusion plate that is not illustrated.

Referring to FIGS. 16A and 16B, the backlight units 2600, 2700, which are edge-type backlight units, may include the wavelength converters 2650, 2750, light guide plates 2640, 2740, reflectors 2620, 2720 on one side of the light guide plates 2640, 2740, and the light sources 2605, 2705, respectively.

Light emitted from the light sources 2605, 2705 may be guided into the light guide plates 2640, 2740 by the reflectors 2620, 2720, respectively. In the backlight unit 2600 of FIG. 16A, the wavelength converter 2650 may be arranged between the light guide plate 2640 and the light source 2605. In the backlight unit 2700 of FIG. 16B, the wavelength converter 2750 may be arranged on a light emitting surface of the light guide plate 2740.

The wavelength converters 2550, 2650, 2750 in FIGS. 15, 16A, and 16B may include general phosphors. In particular, when a quantum dot phosphor is used in order to supplement properties of the quantum dot vulnerable to heat from the light source or moisture, structures of the wavelength converters 2550, 2650, 2750 disclosed in FIGS. 15, 16A, and 16B may be utilized for the backlight units 2500, 2600, 2700.

Figure 17:
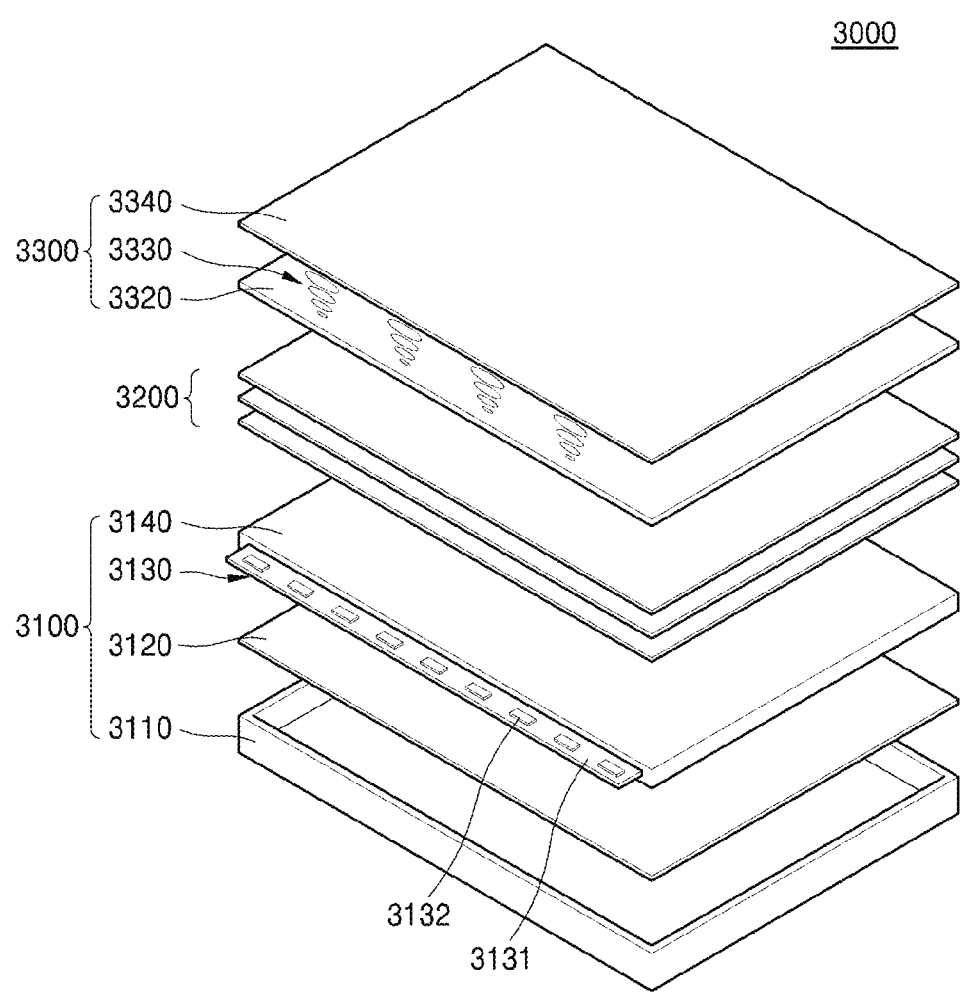
FIG. 17 is a schematic exploded perspective view of a display according to an embodiment.

FIG. 17 is a schematic exploded perspective view of a display according to an embodiment.

Referring to FIG. 17, the display 3000 may include a backlight unit 3100, an optical sheet 3200, and an image display panel 3300 such as a liquid crystal panel.

The backlight unit 3100 may include a bottom case 3110, a reflective plate 3120, a light guide plate 3140, and a light source module 3130 provided on at least one side of the light guide plate 3140. The light source module 3130 may include a printed circuit board 3131 and a light source 3132. In particular, the light source 3132 may be a side view type light emitting element which is mounted to a side adjoining a light emitting surface.

The optical sheet 3200 may be arranged between the light guide plate 3140 and the image display panel 3300, and may include various sheets such as a diffusion sheet, a prism sheet, or a protective sheet.

The image display panel 3300 may display an image using light emitted from the optical sheet 3200. The image display panel 3300 may include an array substrate 3320, a liquid crystal layer 3330, and a color filter substrate 3340. The array substrate 3320 may include pixel electrodes arranged in a matrix shape, thin film transistors applying driving voltages to the pixel electrodes, and signal lines for operating the thin film transistors. The color filter substrate 3340 may include a transparent substrate, a color filter, and a common electrode. The color filter may include filters for selectively passing light of a specific wavelength among white light emitted from the backlight unit 3100. The liquid crystal layer 3330 may be rearranged by an electric field formed between the pixel electrodes and the common electrode, thereby adjusting light transmittance. Light adjusted in terms of light transmittance passes through the color filter of the color filter substrate 3340, thereby displaying an image. The image display panel 3300 may further include a drive circuit unit processing an image signal, or the like.

According to the display 3000 of the present embodiment, since the light source 3132 emitting blue light, green light, and red light, which have relatively small full widths at half maximum, is used, the emitted light can realize high-color purity blue, green, and red colors after passing through the color filter substrate 3340.

Figure 18:
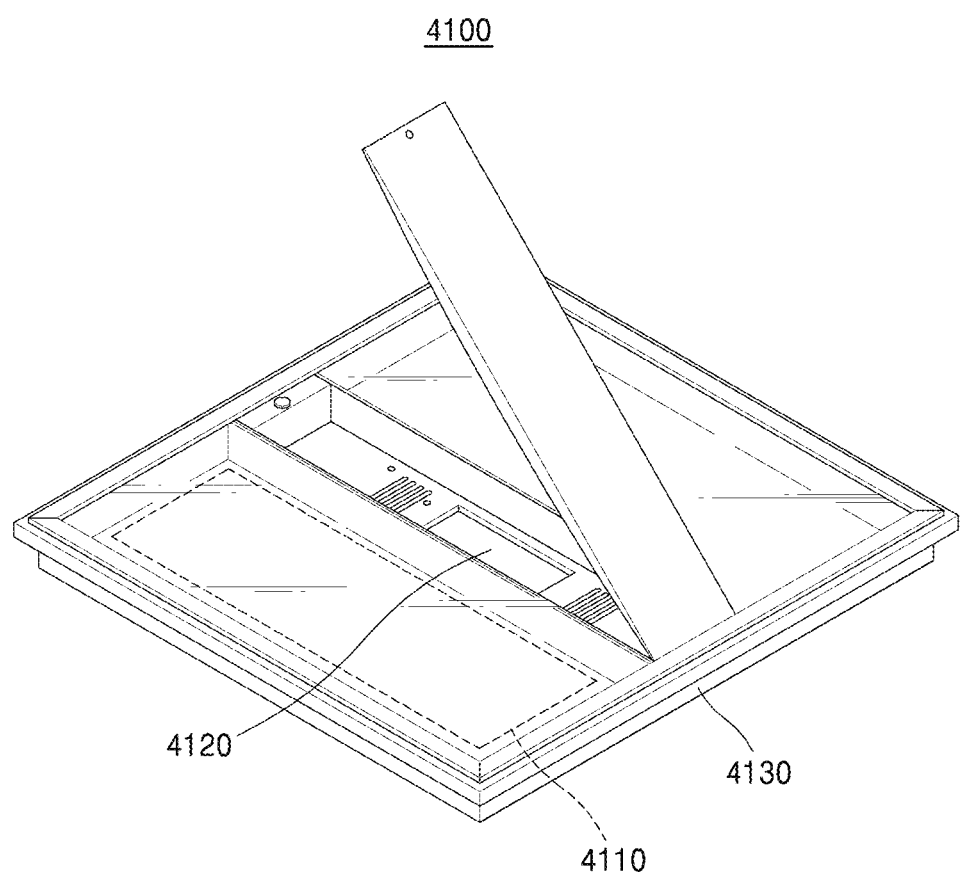
FIG. 18 is a schematic perspective view of a flat illumination device according to an embodiment.

FIG. 18 is a schematic perspective view of a flat illumination device according to an embodiment.

Referring to FIG. 18, a flat illumination device 4100 may include a light source module 4110, a power supply 4120, and a housing 4130. According to an embodiment, the light source module 4110 may include a light emitting element array as a light source, and the power supply 4120 may include a light emitting element driver.

The light source module 4110 may include the light emitting element array, and may be formed in a flat shape as a whole. According to an embodiment, the light emitting element array may include a light emitting element and a controller storing drive information of the light emitting element.

The power supply 4120 may be configured to supply power to the light source module 4110. The housing 4130 may include an accommodating space so as to accommodate the light source module 4110 and the power supply 4120, and may be formed in a hexahedral shape having one open side, without being limited thereto. The light source module 4110 may be arranged to emit light through the open side of the housing 4130.

FIG. 19 is a schematic exploded perspective view showing a bulb type lamp as an illumination device according to an embodiment.

Specifically, an illumination device 4200 may include a socket 4210, a power source unit 4220, a heat dissipating unit 4230, a light source module 4240, and an optical unit 4250. According to an embodiment, the light source module 4240 may include a light emitting element array, and the power source unit 4220 may include a light emitting element driver.

The socket 4210 may be configured such that the illumination device 4200 can replace existing illumination devices. Power supplied to the illumination device 4200 may be applied through the socket 4210. The power source unit 4220 may be separated into a first power source unit 4221 and a second power source unit 4222, as shown in FIG. 19. The heat dissipating unit 4230 may include an inner heat dissipating unit 4231 and an outer heat dissipating unit 4232. In addition, the inner heat dissipating unit 4231 may be connected directly to the light source module 4240 and/or the power source unit 4220, and thus allow heat to be transferred to the outer heat dissipating unit 4232. The optical unit 4250 may include an inner optical unit (not shown) and an outer optical unit (not shown), and may be configured to uniformly dispersing light emitted by the light source module 4240.

The light source module 4240 may be supplied with power from the power source unit 4220 and emit light toward the optical unit 4250. The light source module 4240 may include one or more light emitting elements 4241, a circuit board 4242, and a controller 4243, and the controller 4243 may store drive information of the light emitting elements 4241.

Figure 20:
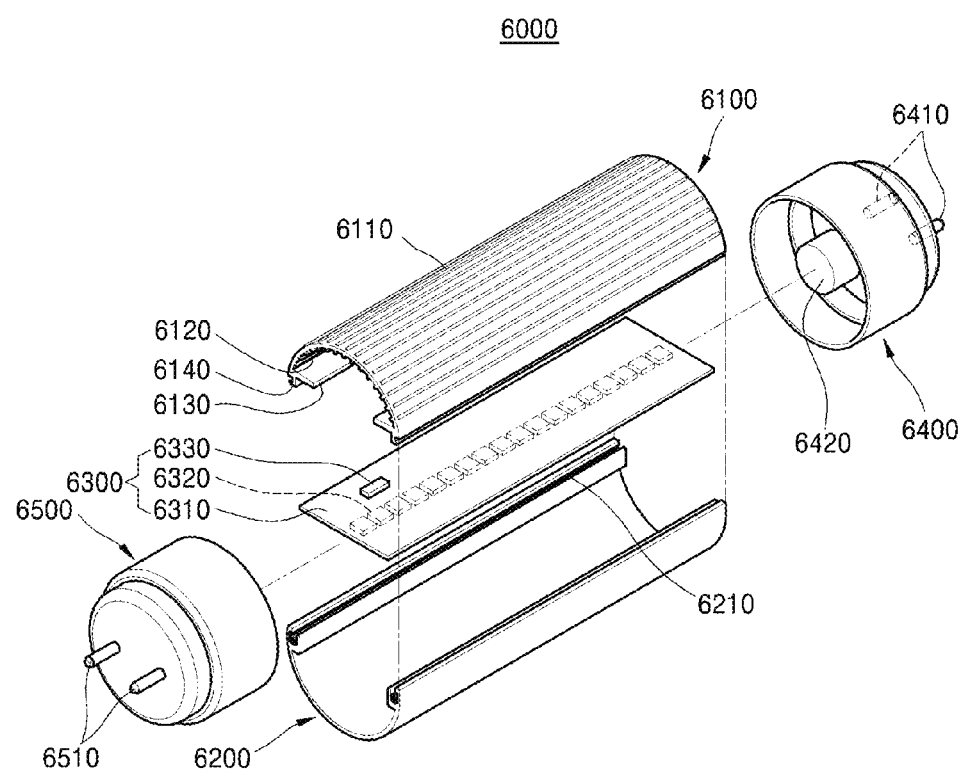
FIG. 20 is a schematic exploded perspective view showing a bar type lamp as an illumination device according to an embodiment.

FIG. 20 is a schematic exploded perspective view showing a bar type lamp as an illumination device according to an embodiment.

Specifically, an illumination device 4400 includes a heat dissipating unit 4410, a cover 4420, a light source module 4430, a first socket 4440, and a second socket 4450. A plurality of heat dissipation fins 4411, 4412 may be formed in an uneven shape on inner and/or outer surfaces of the heat dissipating unit 4410. In addition, the heat dissipation fins 4411, 4412 may have various shapes, and may be arranged at various intervals. A protrusion-shaped support is formed inside the heat dissipating unit 4410. The light source module 4430 may be secured to the support 4413. A bump 4414 may be formed at both ends of the heat dissipating unit 4410.

A groove 4421 is formed on the cover 4420, and the bump 4414 of the heat dissipating unit 4410 may be coupled to the groove 4421 in a hook coupling manner. The groove 4421 and the bump 4414 may be interchangeably formed in terms of positions thereof.

The light source module 4430 may include a light emitting element array. The light source module 4430 may include a printed circuit board 4431, a light source 4432, and a controller 4433. As described above, the controller 4433 may store drive information of the light source 4432. Circuit wires for operating the light source 4432 are formed on the printed circuit board 4431. In addition, the printed circuit board 4431 may include components for operating the light source 4432.

The first and second sockets 4440, 4450, which are a pair of sockets, are respectively coupled to both ends of a cylindrical cover unit including the heat dissipating unit 4410 and the cover 4420. For example, the first socket 4440 may include an electrode terminal 4441 and a power supply 4442, and the second socket 4450 may include a dummy terminal 4451. In addition, an optical sensor and/or a communication module may be embedded in one of the first and second sockets 4440, 4450. For example, the optical sensor and/or the communication module may be embedded in the second socket 4450 including the dummy terminal 4451. As another example, the optical sensor and/or the communication module may be embedded in the first socket 4440 including the electrode terminal 4441.

FIG. 21 is a schematic exploded perspective view showing a lamp, which includes a communication module, as an illumination device according to an embodiment.

Specifically, an illumination device 4300 according to the present embodiment has a difference from the illumination device 4200 disclosed in FIG. 19 in that the illumination device 4300 includes a reflective plate 4310 on an upper side of the light source module 4240, and the reflective plate 4310 can uniformly spread light from a light source toward lateral and rear sides thereof, thereby reducing glare.

A communication module 4320 may be mounted on an upper side of the reflective plate 4310, and home-network communication can be realized through the communication module 4320. For example, the communication module 4320 may be a wireless communication module using Zigbee, WiFi, or LiFi, and may allow control such as On/Off or brightness adjustment of illumination devices, which are mounted inside and outside a home, using a smart phone or a wireless controller. In addition, by use of a LiFi communication module using a visible light wavelength of the illumination device mounted inside and outside the home, electronics and automotive systems, such as TVs, refrigerators, air conditioners, door locks, automobiles, and the like, inside and outside the home may be controlled.

A cover unit 4330 may cover the reflective plate 4310 and the communication module 4320.

Figure 22:
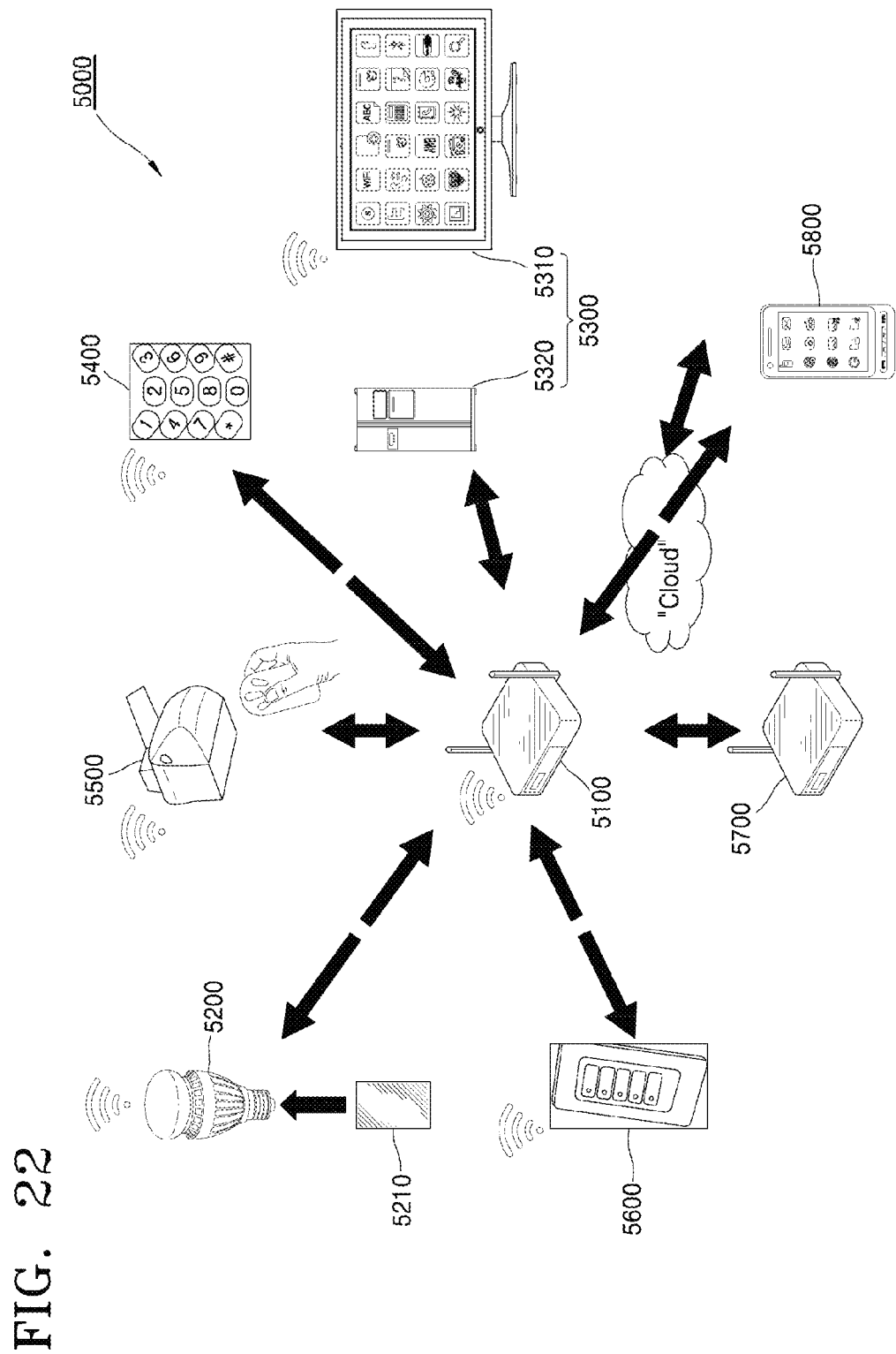
FIG. 22 is a schematic diagram for explaining an indoor illumination control network system.

FIG. 22 is a schematic diagram for explaining an indoor illumination control network system.

A network system 5000 according to the present embodiment may be a complex smart illumination network system, in which illumination techniques using light emitting elements such as LEDs or the like, internet-of-things (IoT) techniques, wireless communication techniques, and the like are fused. The network system 5000 may be realized using various illumination devices and wired and wireless communication devices, and may be realized by sensors, controllers, communication means, software for network control and maintenance, and the like.

The network system 5000 may be applied to closed spaces such as homes and offices, which are defined inside buildings, as well as applied to open spaces such as parks, streets, and the like. The network system 5000 may be realized based on an internet-of-things environment such that various information can be collected/processed to be provided to users. Here, an LED lamp 5200 included in the network system 5000 may control illumination of the LED lamp 5200 itself by receiving information about a surrounding environment from a gateway 5100. In addition, the LED lamp 5200 may serve to perform an operation status check, control, and the like of other devices 5300 to 5800 included in the internet-of-things environment, based on a visible light communication function and the like of the LED lamp 5200.

Referring to FIG. 22, the network system 5000 may include the gateway 5100 for processing data transmitted and received according to different communication protocols, the LED lamp 5200 communicably connected to the gateway 5100 and including an LED light emitting element, and a plurality of devices 5300 to 5800 communicably connected to the gateway 5100 according to various wireless communication manners. To realize the network system 5000 based on the internet-of-things environment, each of the LED lamp 5200 and the devices 5300 to 5800 may include at least one communication module. In an embodiment, the LED lamp 5200 may be connected to the gateway 5100 communicably by a wireless communication protocol such as WiFi, Zigbee, LiFi, or the like, and for this purpose, may have at least one communication module 5210 for lamps.

As described above, the network system 5000 can be applied to closed spaces such as homes or offices as well as applied to open spaces such as streets or parks. When the network system 5000 is applied to a home, the plurality of devices 5300 to 5800, which is included in the network system 5000 and communicably connected to the gateway 5100 based on an internet-of-things technique, may include home appliances 5300, a digital door lock 5400, a garage door lock 5500, an illumination switch 5600 mounted on a wall or the like, a router 5700 for wireless communication network relay, a mobile device 5800 such as a smart phone, a tablet PC, or a laptop computer, and the like.

In the network system 5000, using a wireless communication network (Zigbee, WiFi, LiFi, or the like) mounted in the home, the LED lamp 5200 may check operation status of the various devices 5300 to 5800, or automatically adjust illuminance of the LED lamp 5200 itself according to surrounding environments/situations. In addition, by use of LiFi communications using visible light emitted by the LED lamp 5200, the devices 5300 to 5800 included in the network system 5000 may be controlled.

First, the LED lamp 5200 may automatically adjust the illuminance of the LED lamp 5200, based on surrounding environment information, which is transferred from the gateway 5100 through the communication module 5210 for lamps, or which is collected by a sensor mounted in the LED lamp 5200. For example, according to a kind of program broadcasted on a television 5310 or brightness of a screen of the television 5310, illumination brightness of the LED lamp 5200 may be automatically adjusted. For this purpose, the LED lamp 5200 may receive operation information of the television 5310 from the communication module 5210 for lamps, which is connected to the gateway 5100. The communication module 5210 for lamps may be integrated with a sensor and/or a controller included in the LED lamp 5200, and thus be modularized.

For example, when a program value broadcasted on a TV is a human drama, according to a pre-set value, a color temperature of illumination may be reduced to 12000K or less, for example, 5000K, and a color may be adjusted to provide a cozy atmosphere. On the other hand, when the program value is a gag program, the network system 5000 may be configured such that a color temperature of illumination is increased to 5000K or more according to a set value, and that the illumination is adjusted to blue-based white illumination.

In addition, while no one is present in the home, if a certain time period elapses after the digital door lock 5400 is locked, waste of electricity can be prevented by turning off all of turned-on LED lamps 5200. Alternatively, when a security mode is set through the mobile device 5800, if the digital door lock 5400 is locked while no one is present in the home, the LED lamp 5200 may be maintained in a turn-on state.

Operations of the LED lamp 5200 may be controlled according to surrounding environment information collected by various sensors connected to the network system 5000. For example, when the network system 5000 is realized in a building, illumination, position sensors, and communication modules in the building are combined, and position information of persons in the building is collected, whereby the illumination may be turned on or off. In addition, the collected information is provided in real time, thereby allowing management of facilities or efficient utilization of idle spaces. Generally, since an illumination device such as the LED lamp 5200 is arranged in almost every space of each of floors in the building, various information in the building is collected through a sensor provided integrally with the LED lamp 5200, and can be used for management of facilities, utilization of idle spaces, or the like.

The LED lamp 5200, an image sensor, a storage device, the communication module 5210 for lamps, and the like are combined, thereby providing a device which can be utilized to maintain building security or to sense and handle emergencies. For example, when a sensor sensing smoke, temperature, or the like is attached to the LED lamp 5200, occurrence of fire, or the like can be quickly sensed, thereby minimizing damage. In addition, illumination brightness may be adjusted in consideration of outdoor weather, an amount of sunshine, or the like, thereby saving energy and providing a comfortable illumination environment.

As described above, the network system 5000 can be applied to closed spaces such as homes, offices, or buildings as well as applied to open spaces such as streets, parks, or the like. When the network system 5000 needs to be applied to an open space having no physical limit, realization of the network system 5000 may be relatively difficult due to distance limits of wireless communications, communication interference caused by various obstacles, or the like. A sensor, a communication module, and the like are mounted in each of illumination devices, and each of the illumination devices is used as an information collecting means and a communication relay means, whereby the network system 5000 can be more efficiently realized in an open environment as described above. Hereinafter, descriptions will be made with reference to FIG. 23.

Figure 23:
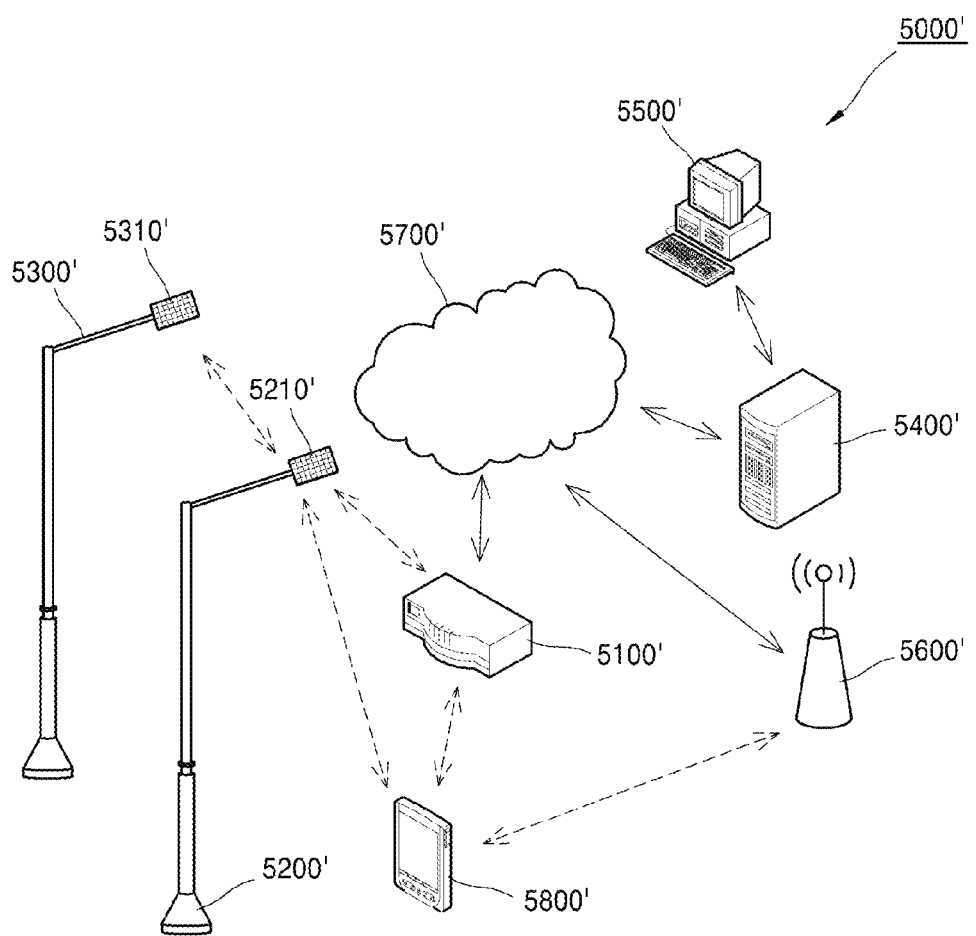
FIG. 23 is a conceptual diagram showing an embodiment of a network system applied to an open space.

FIG. 23 shows an embodiment of a network system 5000' applied to an open space. Referring to FIG. 23, the network system 5000' according to the present embodiment may include a communication connecting device 5100', a plurality of illumination devices 5200', 5300' communicably connected to the communication connecting device 5100' where the plurality of illumination devices 5200' are arranged at predetermined intervals, a server 5400', a computer 5500' for managing the server 5400', a communication base station 5600', a communication network 5700' connecting the communicable equipment set forth above to each other, a mobile device 5800', and the like.

Each of the plurality of illumination devices 5200', 5300' mounted in an exterior open space may include smart engines 5210', 5310'. The smart engines 5210', 5310' may include a sensor collecting information of a surrounding environment, a communication module, and the like, in addition to a light emitting element for emitting light, and a driver for driving the light emitting element. By the communication module, the smart engines 5210', 5310' may be communicated with other surrounding equipment according to a communication protocol such as WiFi, Zigbee, LiFi, or the like.

As an example, one smart engine 5210' may be communicably connected to another smart engine 5310'. Here, a WiFi extension (WiFi mesh) technique may be applied to communications between the smart engines 5210', 5310'. At least one smart engine 5210' may be connected to the communication connecting device 5100', which is connected to the communication network 5700', by wired/wireless communications. To improve an efficiency of communications, several smart engines 5210', 5310' are combined into one group to be connected to the communication connecting device 5100'.

The communication connecting device 5100' is an access point (AP) which enables wired/wireless communications, and may relay communications between the communication network 5700' and another device. The communication connecting device 5100' may be connected to the communication network 5700' by at least one of wired/wireless manners. As an example, the communication connecting device 5100' may be mechanically accommodated in one of the illumination devices 5200', 5300'.

The communication connecting device 5100' may be connected to the mobile device 5800' through a communication protocol such as WiFi or the like. A user of the mobile device 5800' may receive surrounding environment information, which is collected by the plurality of smart engines 5210', 5310', through the communication connecting device 5100' connected to the smart engine 5210' of the illumination device 5200' in the vicinity of the mobile device 5800'. The surrounding environment information may include surrounding traffic information, weather information, and the like. The mobile device 5800' may be connected to the communication network 5700' in a wireless cellular communication manner, such as 3G, 4G, or the like, through the communication base station 5600'.

The server 5400' connected to the communication network 5700' may monitor operation status or the like of each of the illumination devices 5200', 5300' while receiving information collected by the smart engines 5210', 5310' which are respectively mounted in the illumination devices 5200', 5300'. To manage each of the illumination devices 5200', 5300' based on monitoring results of the operation status of each of the illumination devices 5200', 5300', the server 5400' may be connected to the computer 5500' providing a management system. The computer 5500' may execute software or the like which can monitor and manage operation status of each of the illumination devices 5200', 5300', particularly each of the smart engines 5210', 5310'.

While the inventive concept has been particularly shown and described with reference to embodiments thereof, it will be understood that various changes in form and details may be made therein without departing from the spirit and scope of the following claims.

What is claimed is:

1. A material layer stack comprising:
   a substrate having a first lattice constant; and
   a semiconductor layer on the substrate, the semiconductor layer having a second lattice constant that is different from the first lattice constant,
   wherein the semiconductor layer comprises:
      a first impurity layer having a first impurity concentration;
      a second impurity layer having a second impurity concentration that is greater than the first impurity concentration; and
      a third impurity layer having a third impurity concentration that is greater than the second impurity concentration,
   wherein impurities comprised in the first impurity layer, the second impurity layer, and the third impurity layer have the same conductivity type, and
   wherein a thickness of the second impurity layer is about 0.8 times to about 1.2 times a thickness of the first impurity layer.

2. The material layer stack according to claim 1, wherein, among the first impurity layer, the second impurity layer, and the third impurity layer, the first impurity layer is disposed to be closest to the substrate, and the third impurity layer is disposed to be farthest away from the substrate.

3. The material layer stack according to claim 2, wherein the impurities comprised in the first impurity layer, the second impurity layer, and the third impurity layer have an n-type conductivity.

4. The material layer stack according to claim 2, wherein the first impurity concentration, the second impurity concentration, and the third impurity concentration change discretely at interfaces of the impurity layers.

5. The material layer stack according to claim 1, wherein a thickness of the third impurity layer is about 1.8 times to about 2.2 times the thickness of the first impurity layer.

6. The material layer stack according to claim 2, wherein the impurities are silicon (Si) or carbon (C).

7. The material layer stack according to claim 6, wherein the first impurity layer has an impurity concentration of about $1.0 \times 10^{17}$ cm$^{-3}$ to about $2.0 \times 10^{18}$ cm$^{-3}$.

8. The material layer stack according to claim 6, wherein the second impurity layer has an impurity concentration of about $5.0 \times 10^{17}$ cm$^{-3}$ to about $5.0 \times 10^{18}$ cm$^{-3}$.

9. The material layer stack according to claim 6, wherein the third impurity layer has an impurity concentration of about $5.0 \times 10^{18}$ cm$^{-3}$ to about $2.0 \times 10^{19}$ cm$^{-3}$.

10. A light emitting element comprising:
    a first conductivity type semiconductor layer and a second conductivity type semiconductor layer connected to respective electrodes; and
    an active layer configured to generate light using power supplied through the electrodes,
    wherein the first conductivity type semiconductor layer comprises a plurality of impurity layers having different thicknesses and different impurity concentrations such that an impurity layer disposed to be farthest from the active layer has a lowest thickness and a lowest impurity concentration among the impurity layers.

11. The light emitting element of claim 10, wherein an impurity layer disposed to be closest to the active layer is a greatest thickness and has a highest impurity concentration among the impurity layers.

12. The light emitting element of claim 10, wherein the plurality of impurity layers are stacked such that a thickness and an impurity concentration increase by layer in proportion to a distance from a bottom of the first conductivity type semiconductor layer toward the active layer.

13. The light emitting element of claim 12, wherein the impurity concentration changes substantially discontinuously at interfaces of the impurity layers.

14. The light emitting element of claim 12, wherein the impurity concentration changes such that a rate of continuous change in the impurity concentration at an interface between two impurity layers disposed to be closest to the active layer is greater than that at an interface between two impurity layers disposed to be farthest from the active layer among the impurity layers.

15. The light emitting element of claim 12, wherein a thickness and an impurity concentration of an impurity layer disposed between top and bottom impurity layers among the impurity layers are greater than those of the impurity layer disposed to be farthest from the active layer and less than those of an impurity layer disposed to be closest to the active layer among the impurity layers.

16. The light emitting element of claim 10, wherein the impurity concentration of each of the plurality of impurity layers is constant within the each layer such that an impurity concentration at an arbitrary height in the each layer ranges within ±10% of an average impurity concentration of the each layer.

17. The light emitting element of claim 10, wherein the impurity layer disposed to be farthest from the active layer has a highest surface crystallinity and surface uniformity among the impurity layers.

18. A light emitting element comprising:
a substrate;
a first conductivity type semiconductor layer;
a second conductivity type semiconductor layer; and
an active layer interposed between the first conductivity type semiconductor layer and the second conductivity type semiconductor layer,
wherein the first conductivity type semiconductor layer comprises a first impurity layer, a second impurity layer, and a third impurity layer in series,
wherein respective impurity concentrations of the first impurity layer, the second impurity layer, and the third impurity layer sequentially increase from the first impurity layer to the third impurity layer, and
wherein impurity concentrations change at interfaces between the first impurity layer, the second impurity layer, and the third impurity layer, and
wherein the first conductivity type semiconductor layer is interposed between the substrate and the second conductivity type semiconductor layer.

19. A light emitting package comprising:
a light emitting element mounted on a package substrate;
a connector electrically connecting the package substrate to the light emitting element; and
a molding unit molding the light emitting element,
wherein the light emitting element is the light emitting element according to claim 10.

20. The light emitting element according to claim 18, wherein a thickness of the second impurity layer is about 0.8 times to about 1.2 times a thickness of the first impurity layer.

* * * * *